United States Patent
Nagao

(10) Patent No.: US 9,250,273 B2
(45) Date of Patent: Feb. 2, 2016

(54) CURRENT SENSOR

(71) Applicant: FUJITSU COMPONENT LIMITED, Tokyo (JP)

(72) Inventor: Naoyuki Nagao, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 244 days.

(21) Appl. No.: 13/933,796

(22) Filed: Jul. 2, 2013

(65) Prior Publication Data

US 2014/0077797 A1 Mar. 20, 2014

(30) Foreign Application Priority Data

Sep. 20, 2012 (JP) ................................ 2012-206661

(51) Int. Cl.
| | |
|---|---|
| *G01R 33/04* | (2006.01) |
| *G01R 15/20* | (2006.01) |
| *G01R 19/15* | (2006.01) |
| *G01R 19/00* | (2006.01) |
| *G01R 1/20* | (2006.01) |
| G01R 33/07 | (2006.01) |

(52) U.S. Cl.
CPC ................ *G01R 19/15* (2013.01); *G01R 1/203* (2013.01); *G01R 15/202* (2013.01); *G01R 15/207* (2013.01); *G01R 19/0092* (2013.01); *G01R 19/00* (2013.01)

(58) Field of Classification Search
CPC ...... G01R 33/02; G01R 15/202; G01R 33/07; G01R 33/18; G01R 19/0092; G01R 1/203; G01R 15/207; G01R 19/00

USPC .......... 324/117 H, 117 R, 126, 127, 156, 157, 324/227, 228, 236, 244, 253
See application file for complete search history.

(56) References Cited

U.S. PATENT DOCUMENTS

| | | | |
|---|---|---|---|
| 5,391,986 A * | 2/1995 | Sauerbaum | G01N 27/74 324/204 |
| 7,316,576 B2 * | 1/2008 | Saito et al. | 439/76.2 |

(Continued)

FOREIGN PATENT DOCUMENTS

| | | |
|---|---|---|
| JP | 6-16879 | 3/1994 |
| JP | 2002-243768 | 8/2002 |
| JP | 2011-17618 | 1/2011 |
| JP | 2011-159464 | 8/2011 |
| JP | 2012-122793 | 6/2012 |

OTHER PUBLICATIONS

Patent Abstracts of Japan, Publication No. 2002-243768, Published Aug. 28, 2002.

(Continued)

*Primary Examiner* — Jay Patidar
*Assistant Examiner* — Raul Rios Russon
(74) *Attorney, Agent, or Firm* — Staas & Halsey LLP

(57) ABSTRACT

A current sensor includes: a current bar through which a current flows; a first cover that covers the current bar and includes a cutout portion formed in at least a part thereof; a magnetic substance core that covers at least parts of the current bar and the first cover and includes a gap; a magnetic field measuring element located in the gap; and a second cover that covers the magnetic substance core and the magnetic field measuring element and at least parts of the current bar and the first cover, and is located so that a side surface thereof engages with the cutout portion of the first cover.

13 Claims, 25 Drawing Sheets

(56) References Cited

U.S. PATENT DOCUMENTS

| | | | |
|---|---|---|---|
| 7,615,986 B2* | 11/2009 | Nomoto et al. | 324/117 H |
| 8,237,435 B2* | 8/2012 | Hashio et al. | 324/244 |
| 2004/0080308 A1* | 4/2004 | Goto | 324/117 H |
| 2011/0006753 A1 | 1/2011 | Yu et al. | |
| 2011/0068771 A1* | 3/2011 | Ueno | G01R 15/202 324/117 R |
| 2011/0187348 A1 | 8/2011 | Soneda et al. | |
| 2012/0217964 A1* | 8/2012 | Iizuka | G01R 33/0029 324/253 |
| 2013/0187633 A1* | 7/2013 | Yasui | G01R 15/207 324/117 R |

OTHER PUBLICATIONS

Patent Abstracts of Japan, Publication No. 2011-017618, Published Jan. 27, 2011.
Patent Abstracts of Japan, Publication No. 2011-159464, Published Aug. 18, 2011.
Patent Abstracts of Japan, Publication No. 2012-122793, Published Jun. 28, 2012.

* cited by examiner

FIG. 2A
FIG. 2B
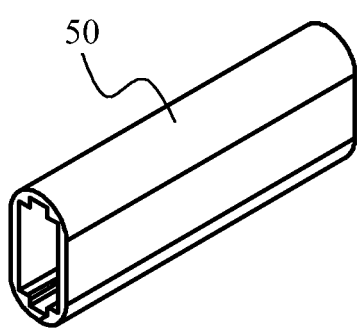
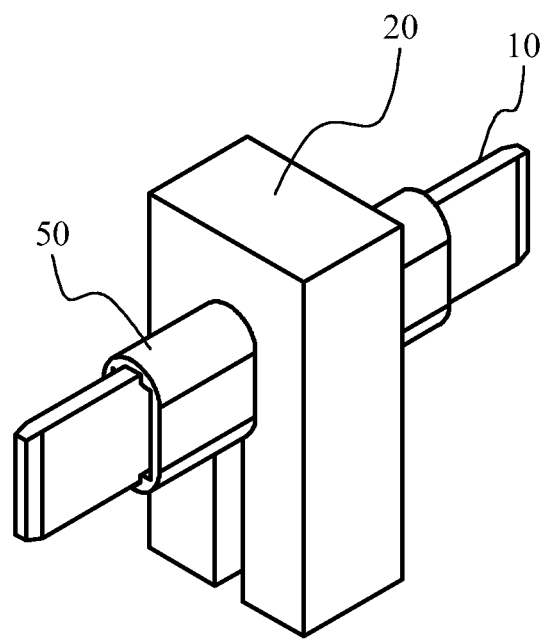

FIG. 3A
FIG. 3B
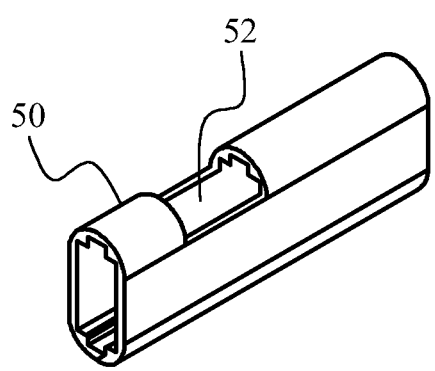
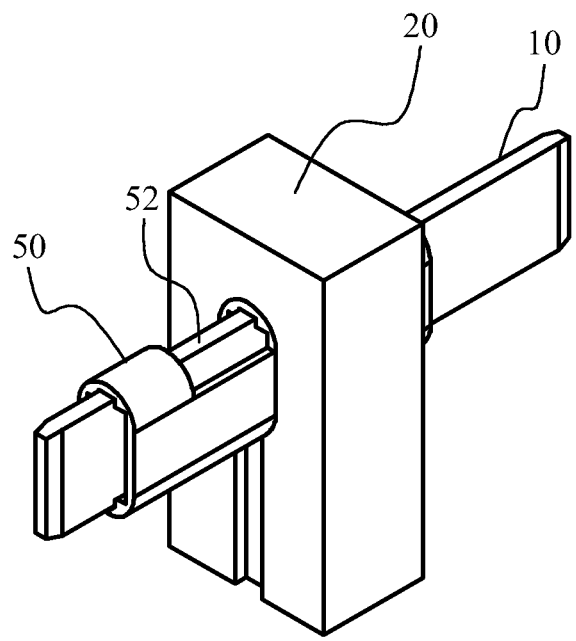

FIG. 13A
FIG. 13B
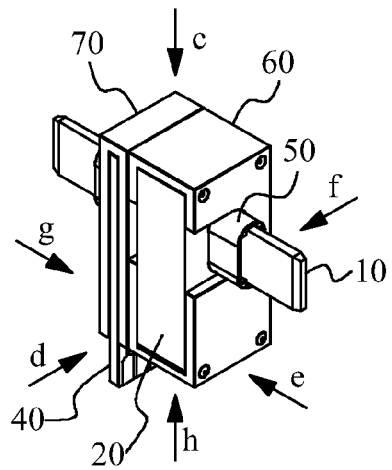
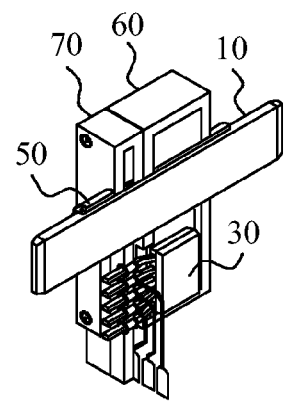
FIG. 13C
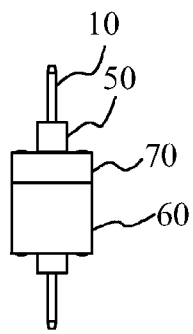
FIG. 13D  FIG. 13E  FIG. 13F  FIG. 13G
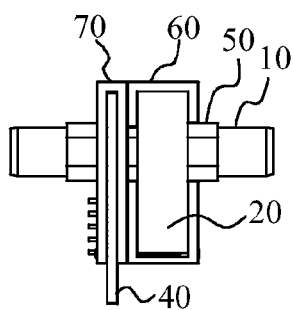 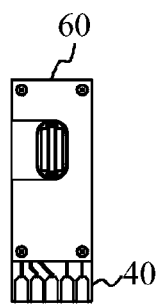 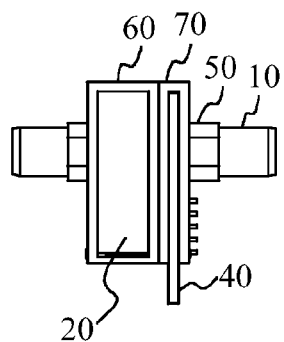 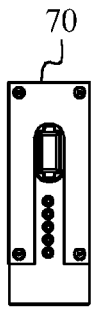
FIG. 13H
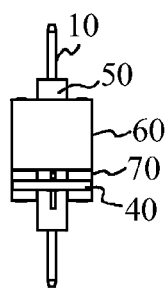

FIG. 14A
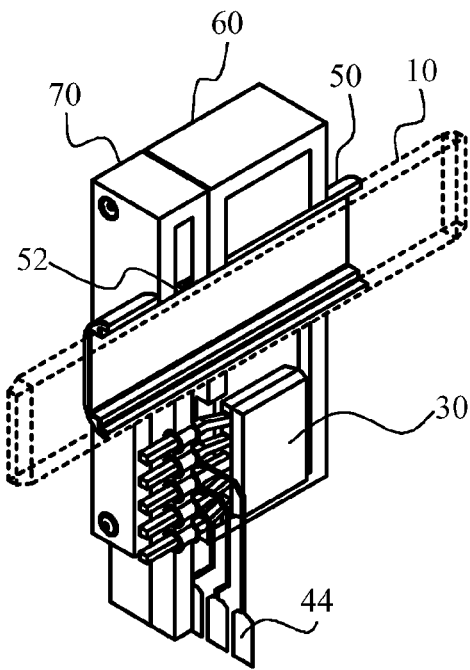
FIG. 14B   FIG. 14C   FIG. 14D
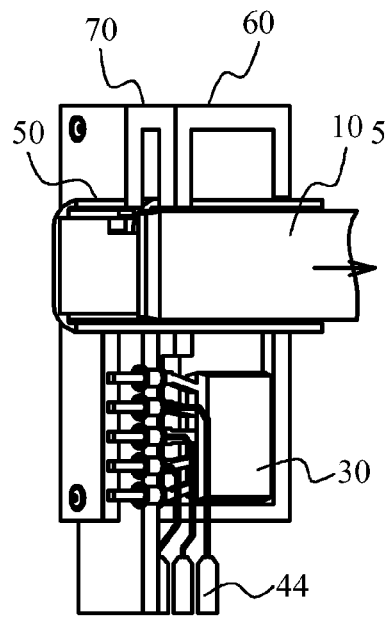 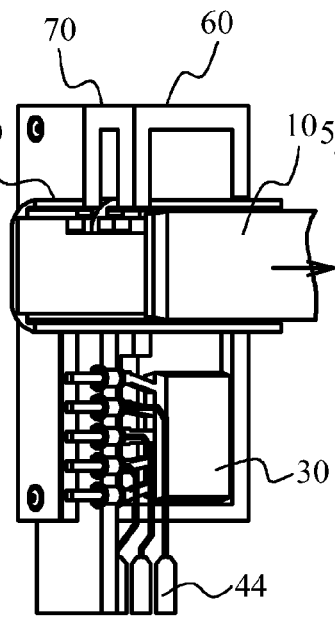 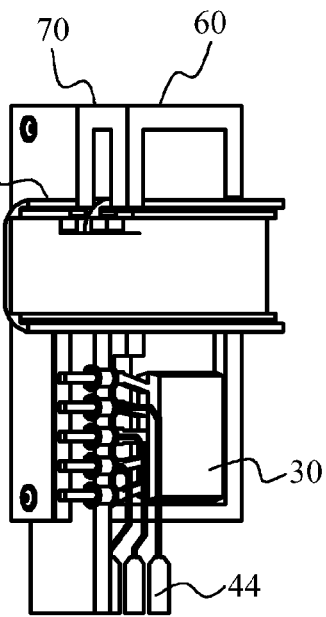

FIG. 18A
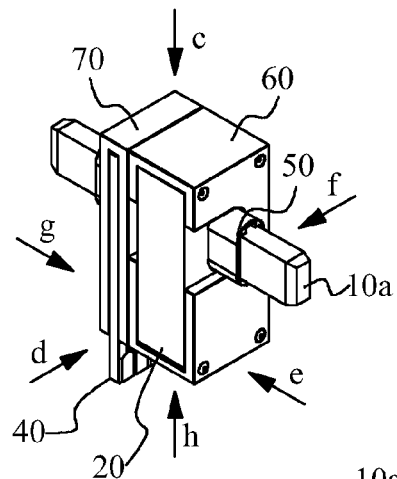
FIG. 18B
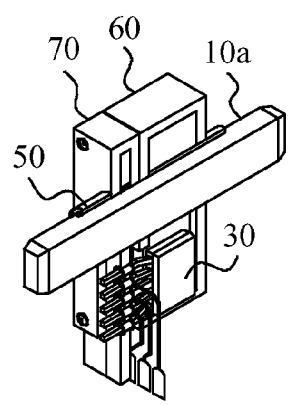
FIG. 18C
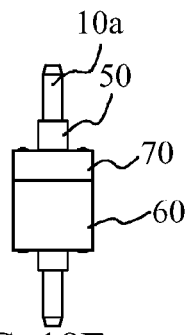
FIG. 18D        FIG. 18E        FIG. 18F        FIG. 18G
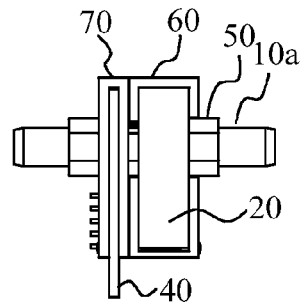 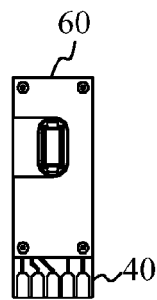 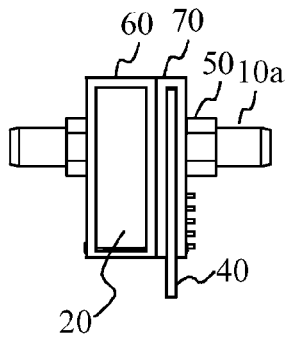 
FIG. 18H
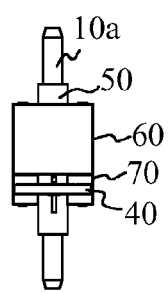

CURRENT SENSOR

CROSS-REFERENCE TO RELATED APPLICATION

This application is based upon and claims the benefit of priority of the prior Japanese Patent Application No. 2012-206661, filed on Sep. 20, 2012, the entire contents of which are incorporated herein by reference.

FIELD

A certain aspect of the embodiments discussed herein is related to a current sensor.

BACKGROUND

There has been known a power sensor including a bus bar through which a current flows and a Hall element for measuring a magnetic field, a part of the bus bar being covered with ferrite, and the Hall element being located in a gap of the ferrite as disclosed in Japanese Patent Application Publication No. 2011-017618. Such a current sensor requires the bus bar, the ferrite, and the Hall element to have a fixed (stable) positional relationship. For example, the positional relationship may be fixed by a ferrite cover including a slit corresponding to a width of the bus bar.

Conventional current sensors have a difficulty in reducing a space because a device to which the current sensor is installed needs to have a structure for preventing a fall of the bus bar and a structure for screwing the ferrite cover.

SUMMARY

According to an aspect of the present invention, there is provided a current sensor including: a first cover that covers the current bar and includes a cutout portion formed in at least a part thereof; a magnetic substance core that covers at least parts of the current bar and the first cover and includes a gap; a magnetic field measuring element located in the gap; and a second cover that covers the magnetic substance core and the magnetic field measuring element and at least parts of the current bar and the first cover, and is located so that a side surface thereof engages with the cutout portion of the first cover.

The object and advantages of the invention will be realized and attained by the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are diagrams illustrating a structure of a current sensor in accordance with a comparative example;

FIGS. 3A and 3B are diagrams illustrating a method for assembling a current sensor in accordance with a first embodiment (No. 1);

FIGS. 13A through 13H are completion drawings of the current sensor in accordance with the first embodiment;

FIGS. 14A through 14D are diagrams for explaining an engaging state of components (No. 1);

FIGS. 18A through 18H are completion drawings of a current sensor into which the bus bar with a different shape is inserted;

DESCRIPTION OF EMBODIMENTS

A description will first be given of a principle of a current sensor and a comparative example.

Figure 1A:
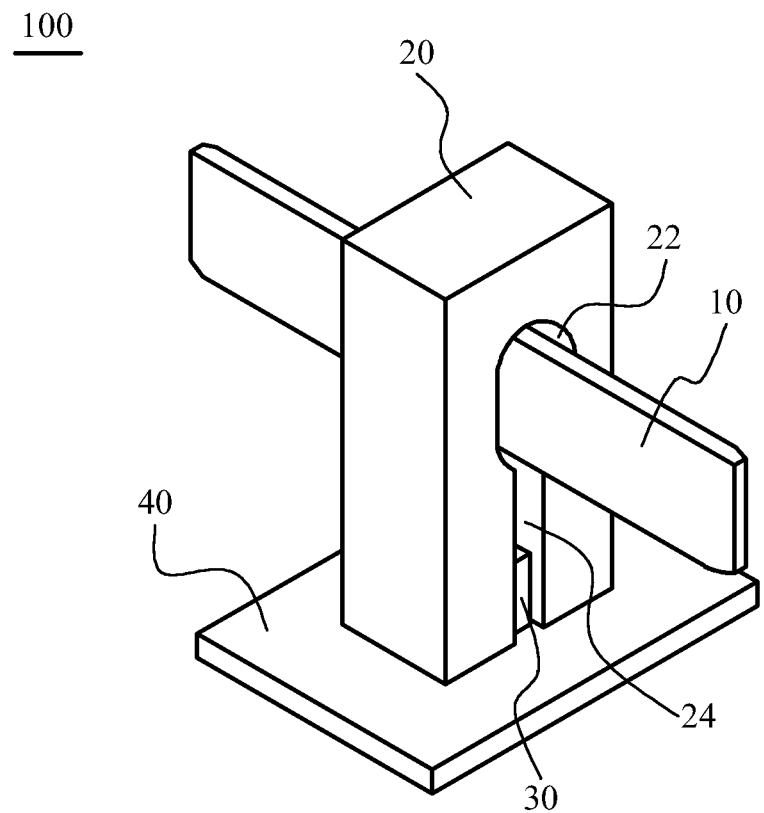
FIGS. 1A and 1B are diagrams illustrating a principle of a current sensor.
Figure 1B:
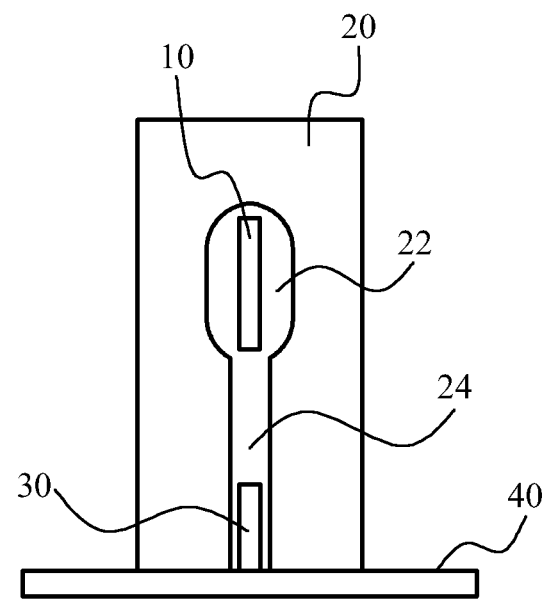

FIGS. 1A and 1B are diagrams illustrating a principle of current sensors in accordance with a comparative example and first through fourth embodiments. FIG. 1A is a perspective view, and FIG. 1B is a plan view viewing FIG. 1A from a penetration direction of a bus bar 10.

As illustrated in FIG. 1A, a current sensor 100 includes the bus bar 10, ferrite 20, a Hall element 30, and a substrate 40. The bus bar 10 is an exemplary current bar through which a measured current flows, and has an elongated plate-like shape. The ferrite 20 is an exemplary magnetic substance core that enhances a magnetic field generated by a current flowing through the bus bar 10. The Hall element 30 is an exemplary magnetic field measuring element for measuring the magnetic field enhanced by the ferrite 20, and is fixed to the substrate 40. The substrate 40 includes wirings (not illustrated), and the wirings are electrically coupled to the Hall element 30. A measuring circuit (not illustrated) for measuring an output signal of the Hall element is located at ends of the wirings formed on the substrate 40, and thus, the current flowing through the bus bar 10 can be detected based on the output.

The ferrite 20 is shaped in such a manner that side surfaces of a cuboid are hollowed out through an opposite side to be keyhole-shaped as illustrated in FIG. 1A, for example. In the following description, a center portion (base portion of the keyhole) in the above described hollow is described as a hole portion 22, and a slit portion heading from the hole portion 22 to a bottom surface (tip portion of the keyhole) is described as a gap 24. As illustrated in FIG. 1B, the bus bar 10 is located so as to penetrate the hole portion 22, and the Hall element 30 is located in the gap 24. The ferrite 20 has only to have a shape covering a part of the bus bar 10 in an extending direction, and the shape thereof is not limited to the tangible shape illustrated to FIG. 1.

To perform correct measurement with the sensor, the bus bar 10, the ferrite 20, and the Hall element 30 preferably have a fixed positional relationship. Especially, if the bus bar 10 comes in contact with the ferrite 20, the current flowing through the bus bar 10 causes a danger such as an electric shock and thus, they are preferably located away from each other as illustrated in FIG. 1B.

The positional relationship can be fixed by filling up a clearance between the bus bar 10 and the ferrite 20 with a liquid such as an adhesive, but the cost for drying treatment till the liquid is solidified is high, and thus this method is not preferable. Moreover, a bus cover including a slit having the practically same width as that of the bus bar 10 may be placed over the bus bar 10 and the ferrite 20 and fixed to the substrate 40 (see FIGS. 16A and 16B). However, this method requires the substrate 40 to have a structure (e.g. a screw clamp, a nail, or the like) for fixing the positional relationship, and thus the positional relationship cannot be fixed with the current sensor 100 alone. Therefore, a structure presented by the comparative example (FIGS. 2A and 2B) will be considered.

FIGS. 2A and 2B are diagrams illustrating a structure of a ferrite portion of a current sensor in accordance with the comparative example. FIG. 2A illustrates a bus cover, and FIG. 2B is a diagram illustrating a state where the bus bar 10 with the bus cover is installed in the ferrite 20. As illustrated in FIG. 2A, a bus cover 50 includes a cavity corresponding to the bus bar 10 formed in the inside thereof, and has a tubular shape as a whole. As illustrated in FIG. 2B, the bus cover 50 with the bus bar 10 penetrating therethrough is inserted into the hole portion of the ferrite 20, and thereby, prevents contact between the ferrite 20 and the bus bar 10 and can protect a user from electrocution. This method can be achieved only by covering the bus bar 10 with the bus cover 50, and thus the positional relationship can be fixed by the current sensor 100 alone.

However, the method in accordance with the comparative example has a possibility that the bus cover 50 falls down from the ferrite 20. Thus, a detailed description will be given of a structure of current sensors capable of stabilizing a positional relationship among the bus bar 10, the ferrite 20, and the Hall element 30 in the following embodiments.

[First Embodiment]

First, a description will be given of a method for assembling the current sensor 100 in accordance with a first embodiment based on FIG. 3A through FIG. 7B. Then, a description will be given of a detail of each component constituting the current sensor 100 based on FIG. 8A through FIG. 12E, and finally a description will be given of a detailed structure of the current sensor 100 based on FIG. 14A through FIG. 16B.

FIG. 3A through FIG. 7B are perspective views illustrating the method for assembling the current sensor 100 of the first embodiment. As illustrated in FIG. 3A, prepared is the bus cover 50 that is an exemplary first cover. Unlike the comparative example, the bus cover 50 of the first embodiment includes a cutout portion 52 in an upper surface thereof. The cutout portion 52 is formed by removing a part of the bus cover 50, and the inside of the bus cover 50 is exposed from the cutout portion 52. The cutout portion 52 is a structure for engaging with (hanging) side surfaces of a ferrite cover and a substrate cover as described later.

Then, the bus bar 10 is passed through the bus cover 50, and the bus cover 50 with the bus bar 10 is passed through the hole portion 22 of the ferrite 20 as illustrated in FIG. 3B. At this point, as the bus bar 10 is exposed to an outside from the cutout portion 52, the bus cover 50 is located so that the cutout portion 52 is positioned outside the ferrite 20 to prevent the bus bar 10 from contacting the ferrite 20.

Figure 4A:
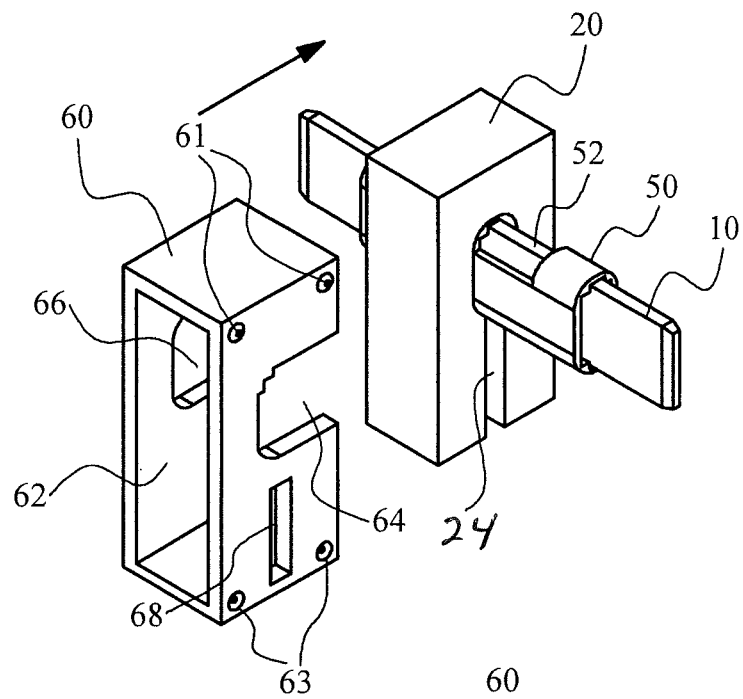
FIGS. 4A and 4B are diagrams illustrating the method for assembling the current sensor in accordance with the first embodiment (No. 2)
Figure 4B:
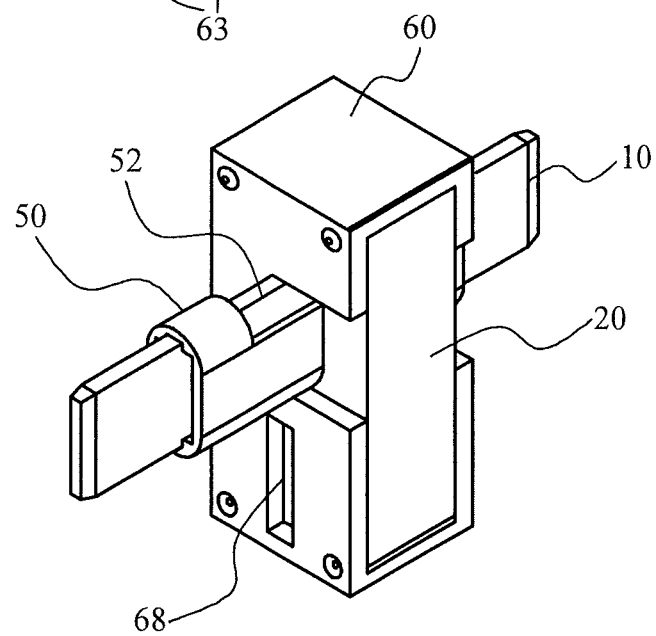

Then, a ferrite cover 60 is placed to cover the ferrite 20 as illustrated in FIG. 4A and FIG. 4B. The ferrite cover 60 is an exemplary second cover that protects the ferrite 20, but also has a function for fixing the positional relationship among the bus bar 10, the bus cover 50, and the ferrite 20 in the present embodiment. One of side surfaces of the ferrite cover 60 is an opening portion 62, and the whole of the ferrite 20 is housed inside the ferrite cover 60 from the opening portion 62. Further, recess portions 64 and 66 are formed in two side surfaces adjacent to the opening portion 62 (i.e. two side surfaces penetrated by the bus bar 10), and the bus bar 10 and the bus cover 50 are placed in the recess portions 64 and 66. In addition, a slit 68 into which the Hall element 30 is inserted in a process described later is formed in one of the side surfaces penetrated by the bus bar 10.

Figure 5A:
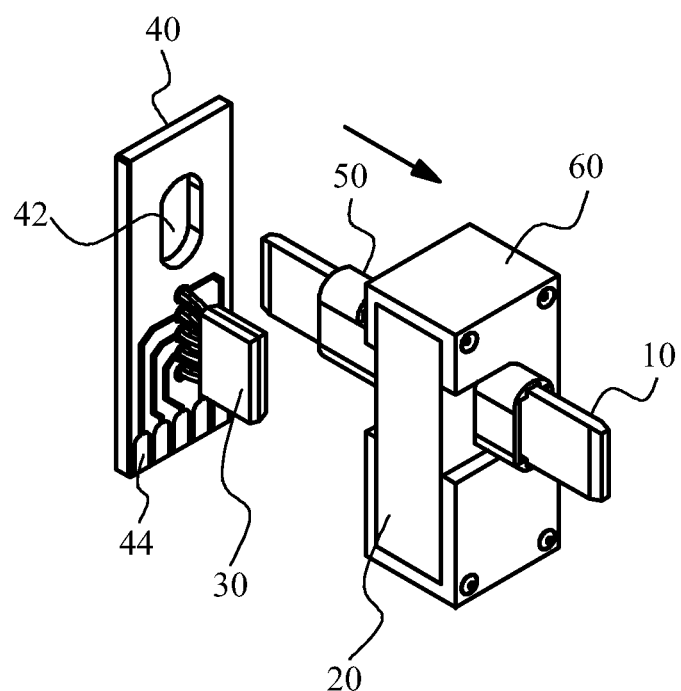
FIGS. 5A and 5B are diagrams illustrating the method for assembling the current sensor in accordance with the first embodiment (No. 3)
Figure 5B:
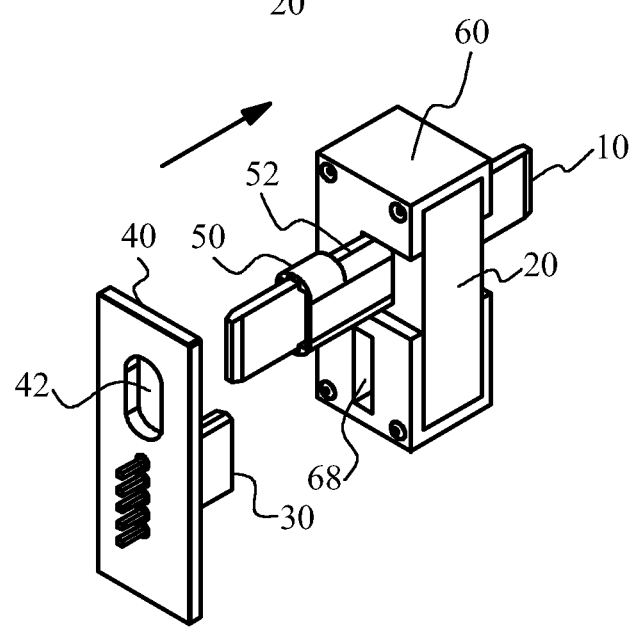

Then, the substrate 40 is mounted on to the bus bar 10 as illustrated in FIG. 5A and FIG. 5B. A penetration hole 42 larger than the cross-section of the bus cover 50 is formed in the substrate 40. The bus cover 50 and the bus bar 10 are passed through the penetration hole 42, and thereby the substrate 40 is hung on the cutout portion 52 of the bus cover 50 (i.e. bus bar 10) and tentatively positioned. Moreover, wirings 44 are formed on the substrate 40, and the Hall element 30 electrically coupled to the wirings 44 is fixed to the substrate 40. The Hall element 30 protrudes from the surface of the substrate 40, and is inserted from the slit 68 of the ferrite cover 60 into the inside and positioned in the gap 24 of the ferrite 20 when the substrate 40 is hung on the bus bar 10.

Figures 6A, 6B:
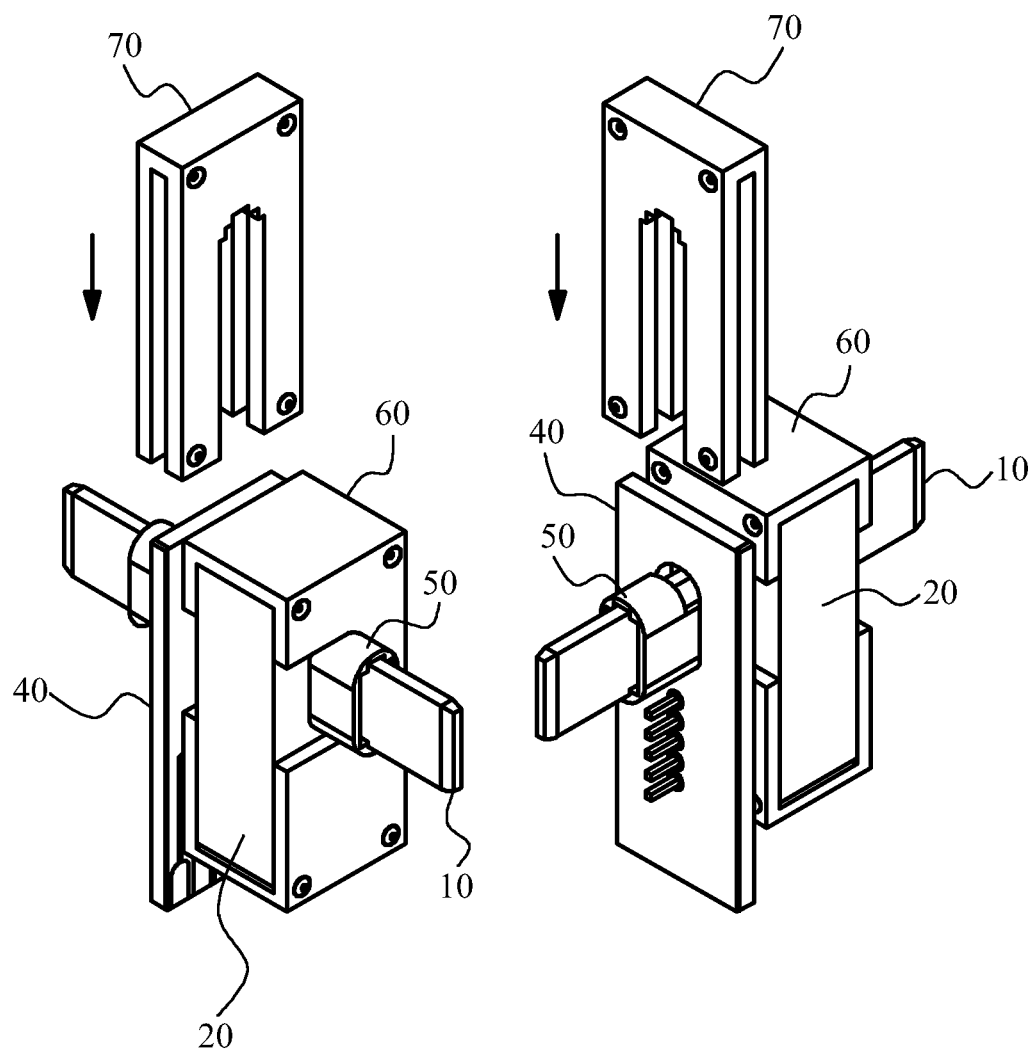
FIGS. 6A and 6B are diagrams illustrating the method for assembling the current sensor in accordance with the first embodiment (No. 4)

Then as illustrated in FIGS. 6A and 6B, a substrate cover 70 is placed to cover the substrate 40. Unlike the ferrite cover 60, the substrate cover 70 is mounted on to the substrate 40 from an upper direction (direction counter to gravity). At this point, a side surface of the substrate cover 70 engages with the cutout portion 52 of the bus cover 50. Moreover, side surfaces of the ferrite cover 60 and the substrate cover 70 contact each other and a raised structure and a recess structure formed in the side surfaces engage with each other, and thereby, the ferrite cover 60 and the substrate cover 70 are fixed to each other. This will be described in detail later.

Figure 7A:
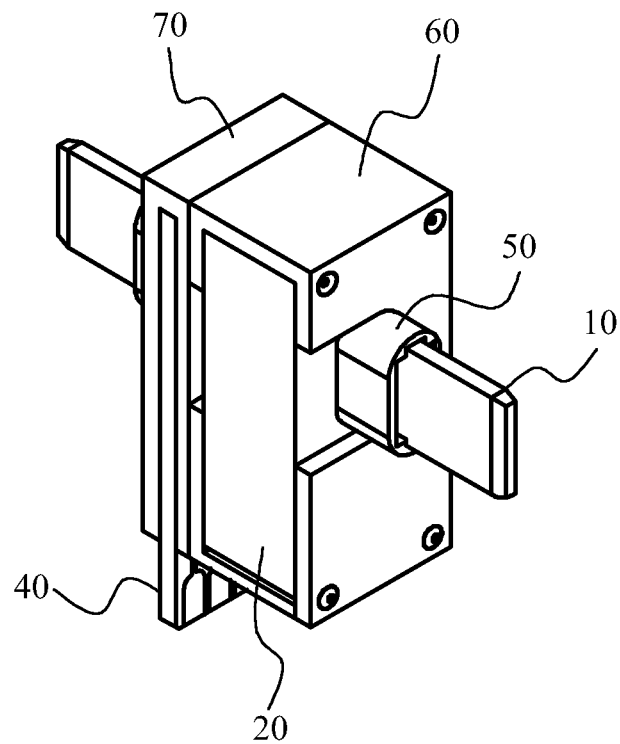
FIGS. 7A and 7B are diagrams illustrating the method for assembling the current sensor in accordance with the first embodiment (No. 5)
Figure 7B:
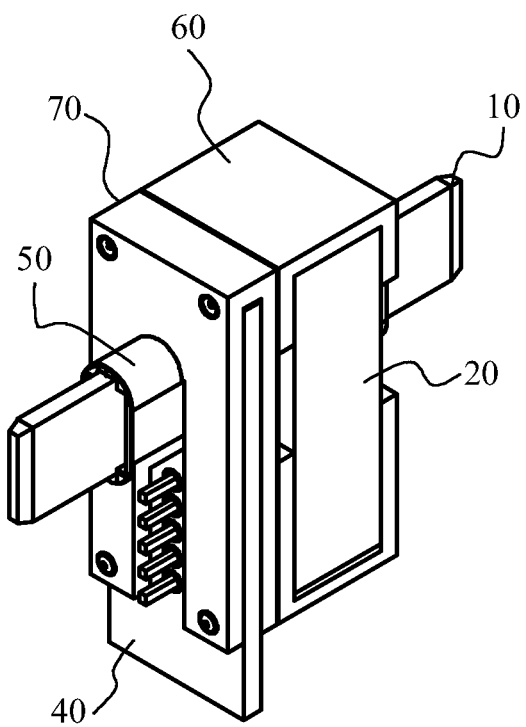

FIG. 7A and FIG. 7B are perspective views of the current sensor 100 to which the substrate cover 70 is mounted on. The cutout portion 52 of the bus cover 50 has a length (length in a direction in which the bus bar 10 extends) configured to be equal to the sum of the overall thickness of the substrate cover 70 and the thickness of one of the side surfaces of the ferrite cover 60. This configuration allows the ferrite cover 60 and the substrate cover 70 to be engaged with and fixed to the cutout portion 52 of the bus cover 50.

Figure 8A:
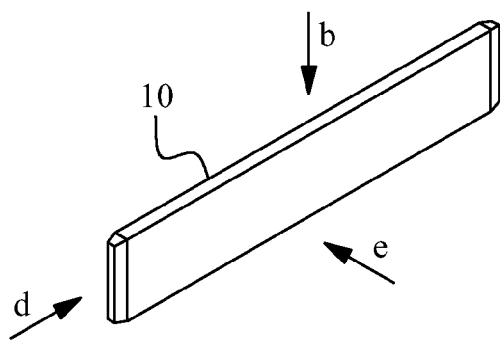
FIGS. 8A through 8D are diagrams illustrating a detailed structure of a bus bar.
Figure 8B:
Figure 8C:
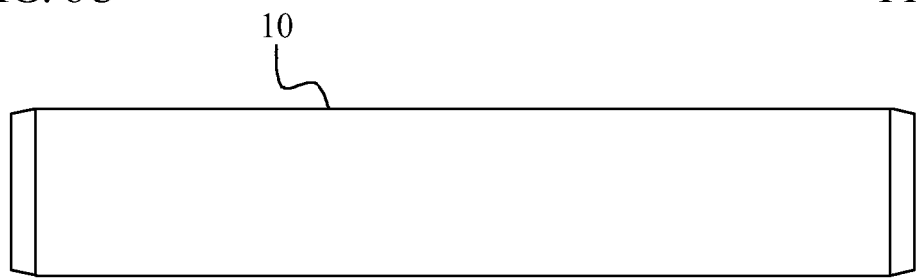
Figure 8D:
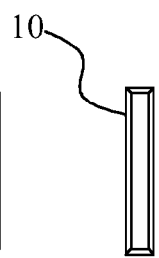

FIGS. 8A through 8D are diagrams illustrating a detailed structure of the bus bar 10. FIG. 8A is a perspective view, and FIGS. 8B through 8D are plan views viewed from b through d-directions in FIG. 8A respectively. As illustrated, the bus bar 10 has an elongated plate-like shape in one direction (d-direction). As illustrated in FIGS. 8B through 8D, both end portions of the bus bar 10 are inclined so that the cross-sections thereof decrease toward the outside. The structure of the bus bar 10 is not limited to the present embodiment, and may be any that allows a measured current to flow therethrough.

Figure 9A:
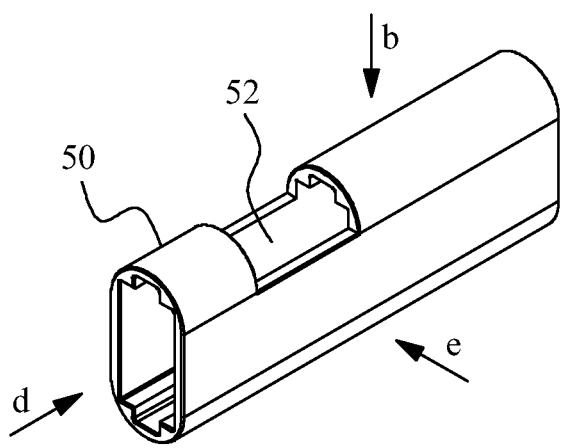
FIGS. 9A through 9D are diagrams illustrating a detailed structure of a bus cover.
Figure 9B:
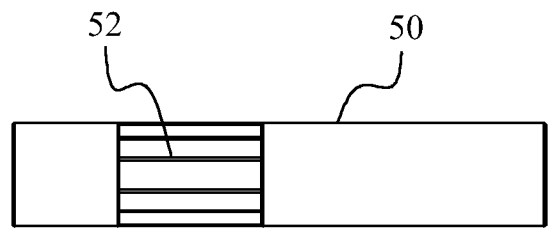
Figure 9C:
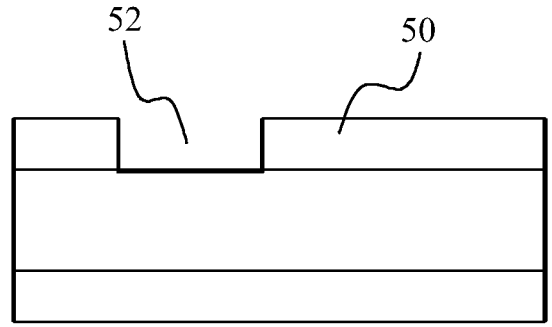
Figure 9D:
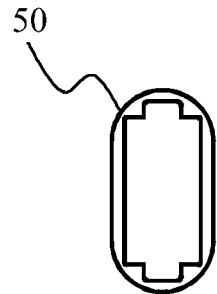
Figure 10A:
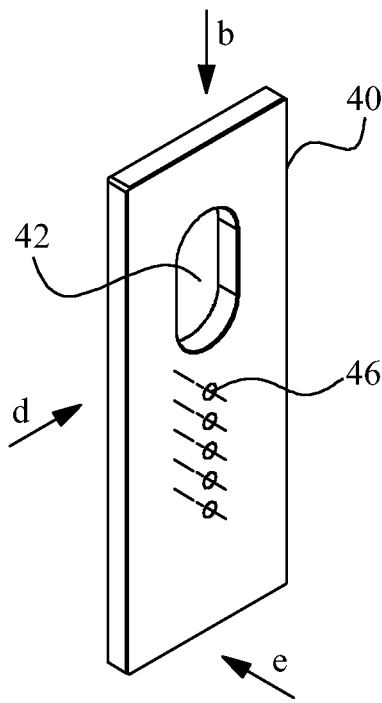
FIGS. 10A through 10D are diagrams illustrating a detailed structure of a substrate.
Figure 10B:
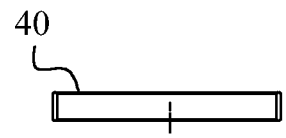
Figure 10C:
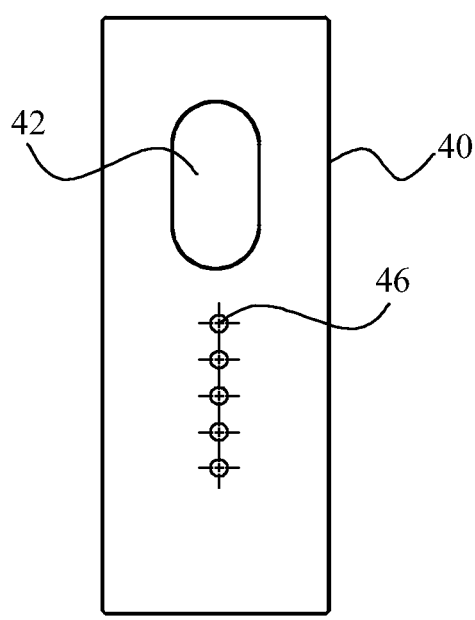
Figure 10D:
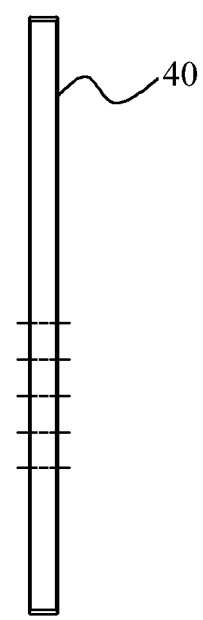

FIGS. 9A through 9D are diagrams illustrating a detailed structure of the bus cover 50. FIG. 9A is a perspective view, and FIGS. 9B through 9D are plan views viewed from b through d-directions in FIG. 9A respectively. As illustrated in FIG. 9B, an upper portion of the bus cover 50 is removed to the cutout portion 52, and the inside of the bus cover 50 is exposed, but the structure of the cutout portion 52 is not limited to the present embodiment and may be any that can engage with the ferrite cover 60 and the substrate cover 70. In addition, as illustrated in FIG. 9D, the cavity formed in the bus cover 50 into which the bus bar 10 is inserted has a nearly cross shape formed by crossing two rectangles with different shapes at centers thereof. This configuration is for allowing the bus bars 10 with different sizes to be inserted, and this will be described in detail later.

FIG. 10 is a diagram illustrating a detailed structure of the substrate 40. FIG. 10A is a perspective view, and FIGS. 10B through 10D are plan views viewed from b through d-directions in FIG. 10A respectively. FIGS. 10A through 10D omit the illustration of the Hall element 30 and the wirings 44. As illustrated in FIGS. 10A and 10C, the substrate 40 includes: the penetration hole 42 into which the bus bar 10 and the bus cover 50 are inserted; and pin holes 46 to which pins of the Hall element 30 are inserted. The Hall element 30 is fixed to the substrate 40 by inserting the pins to the pin holes 46 and penetrating them through the opposite side.

Figure 11A:
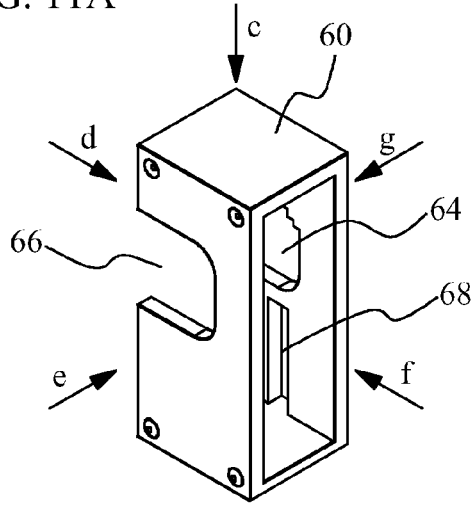
FIGS. 11A through 11G are diagrams illustrating a detailed structure of a ferrite cover.
Figure 11B:
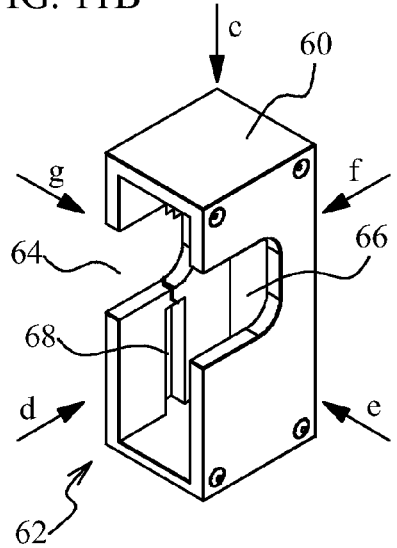
Figure 11C:
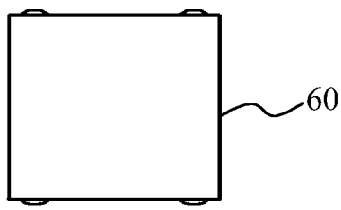
Figure 11D:
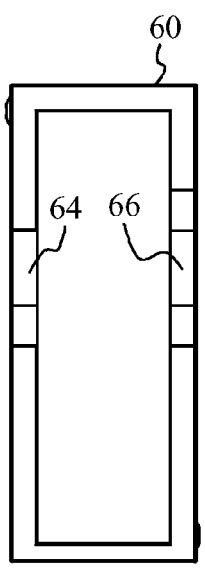
Figure 11E:
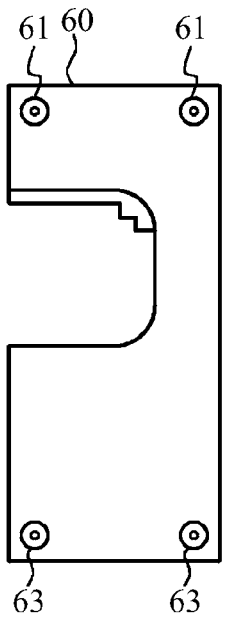
Figure 11F:
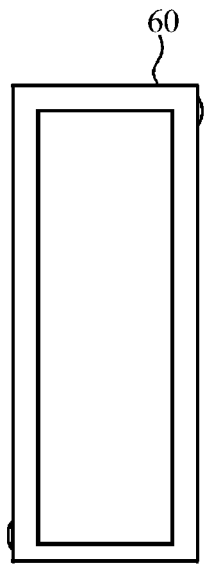
Figure 11G:
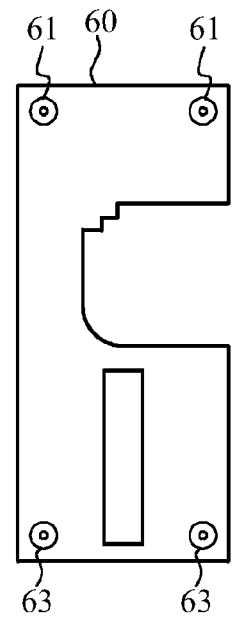

FIGS. 11A through 11G are diagrams illustrating a detailed structure of the ferrite cover 60. FIG. 11A and FIG. 11B are perspective views viewed from different directions, and FIG. 11C through FIG. 11D are plan views viewed from c through g-directions in the perspective views respectively. As illustrated, the side surface in the d-direction of the ferrite cover 60 is the opening portion 62 from which the ferrite 20 is inserted. The side surfaces in the e-direction and the g-direction of the ferrite cover 60 include the recess portions 64 and 66 communicating with the opening portion 62, respectively. The recess portion 64 formed in the side surface in the g-direction engages with the cutout portion 52 of the bus cover 50, and thus is smaller than the recess portion 66 formed in the side surface in the e-direction, and a corner portion thereof is not rounded so as to make the engagement easy. In contrast, the recess portion formed in the side surface in the e-direction does not engage with the cutout portion 52 of the bus cover 50, and thus is larger than the recess portion 64 formed in the side surface in the g-direction, and corner portions are rounded so as to be along the chassis of the bus cover 50. These configurations are illustrated in FIG. 11D, FIG. 11E, and FIG. 11G.

Moreover, recess and raised structures that engage with the substrate cover 70 are formed in the ferrite cover 60. The present embodiment forms recess structures 61 at an upper side (side closer to the bus bar 10) and raised structures 63 at a lower side, but does not intend to suggest any limitation. Moreover, the side surface in the f-direction of the ferrite cover 60 is an opening portion as with the side surface in the d-direction in the present embodiment, but the ferrite cover 60 has only to cover the ferrite 20 from at least the d-direction or the f-direction, and the other opening portion may be closed.

Figure 12A:
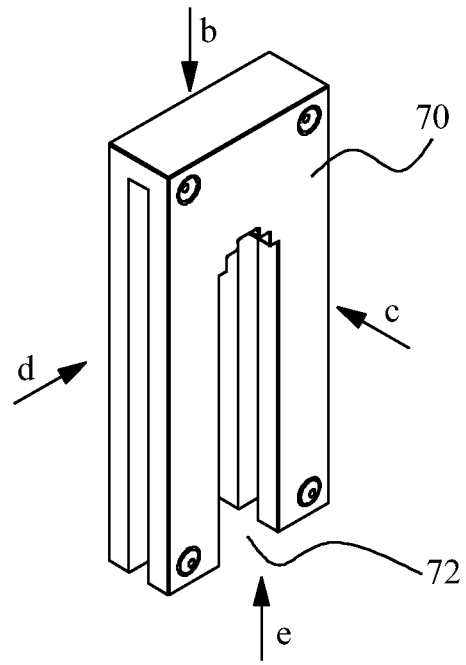
FIGS. 12A through 12E are diagrams illustrating a detailed structure of a substrate cover.
Figure 12B:

FIGS. 12A through 12E are diagrams illustrating a detailed structure of the substrate cover 70. FIG. 12A is a perspective view, and FIGS. 12B through 12E are plan views viewed from b through e-directions in FIG. 12A respectively. As illustrated, two side surfaces of the substrate cover 70 (c-direction and counter direction thereof) include recess portions 72 formed therein so as to open toward the bottom side (e-direction). A cross-sectional shape of the base portion of the recess portion 72 is a step-like shape as indicated by reference numeral 74 in FIG. 12C. This is for engaging with a multilevel structure formed by the bus bar 10 exposed from the cutout portion 52 and the chassis of the bus cover 50 in the cutout portion 52 of the bus cover 50. This structure allows the substrate cover 70 to stably support the bus cover 50.

In addition, recess and raised structures for engaging with the ferrite cover 60 are formed in the substrate cover 70. The present embodiment forms raised structures 75 at an upper side (side closer to the bus bar 10) so as to engage with the ferrite cover 60 of FIGS. 11A through 11G, and forms recess structures 77 at a lower side, but does not intend to suggest any limitation.

FIGS. 13A through 13H are diagrams illustrating a detailed structure of a completion state of the current sensor 100. FIG. 13A is an external perspective view, and FIG. 13B is a perspective view in which the current sensor 100 is halved lengthwise. FIGS. 13C through 13H are plan views viewed from c through h-direction in FIG. 13A respectively. As illustrated, the bus bar 10 is inserted into the inside of the bus cover 50 to be positioned with respect to the ferrite 20. Especially, in the inside of the ferrite cover 60, the bus cover 50 separates the bus bar 10 from the ferrite 20, and prevents contact therebetween. Moreover, the Hall element 30 electrically coupled to the substrate 40 is inserted from the slit 68 of the ferrite cover 60 into the gap 24 of the ferrite 20, and positioned with respect to the ferrite 20. An engaging state of the bus cover 50, the ferrite cover 60, and the substrate cover 70 will be described in detail in FIG. 14A through FIG. 15D.

FIGS. 14A through 14D are diagrams for explaining an engaging state of components in the current sensor 100 (No. 1), and illustrate the current sensor 100 halved lengthwise as with FIG. 13B. As illustrated in FIG. 14A, a first outer periphery of the cutout portion 52 of the bus cover 50 engages with the side surface of the substrate cover 70, and a second outer periphery engages with the side surface of the ferrite cover 60. The bus bar 10 inserted into the bus cover 50 fails to engage with the substrate cover 70 and the ferrite cover 60, and thus can be freely moved along its extending direction (insertion direction) as illustrated in FIGS. 14B through 14D. Therefore, in an assembly process, the components except the bus bar 10 are assembled first, and the bus bar 10 can be inserted lastly.

Figure 15A:
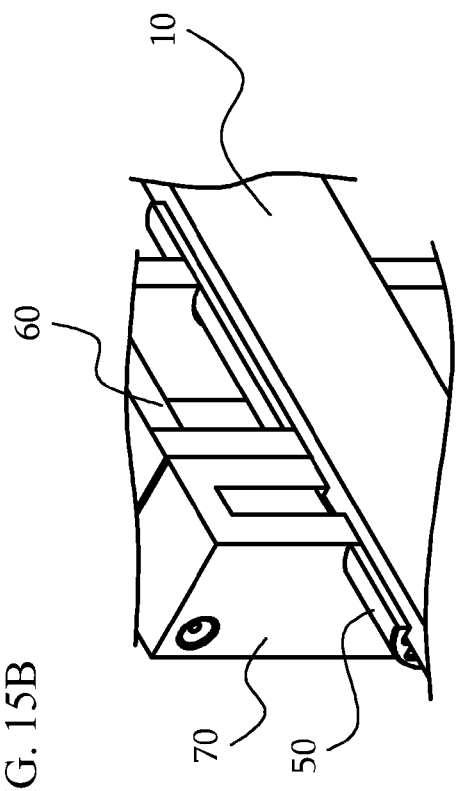
FIGS. 15A through 15D are diagrams for explaining the engaging state of components (No. 2)
Figure 15B:
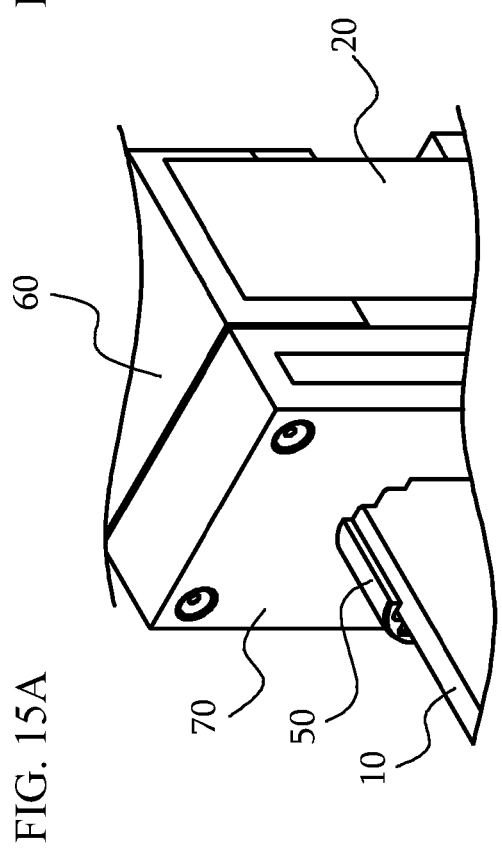
Figure 15C:
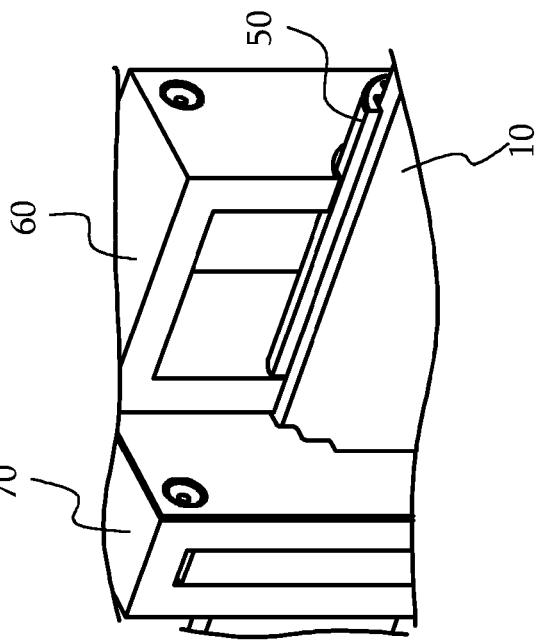
Figure 15D:
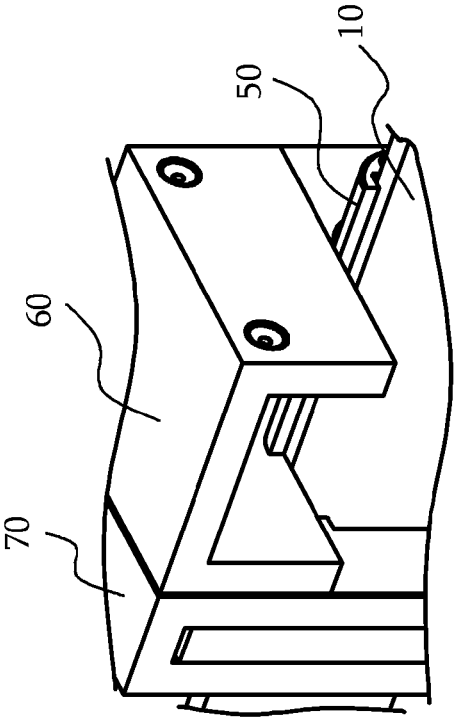

FIGS. 15A through 15D are diagrams for explaining the engaging state of the components in the current sensor 100 (No. 2), and enlarge an engaging part illustrated in FIGS. 14A through 14D. As illustrated in FIG. 15A, the step-like shape of the recess portion 72 of the substrate cover 70 engages with the multilevel structure of the cutout portion 52 formed by the bus bar 10 and the bus cover 50. In addition, as illustrated in FIGS. 15B and 15D, the side surface of the ferrite cover 60 located on the opposite side to the substrate cover 70 does not engage with the cutout portion 52 of the bus cover 50, and contacts the bus cover 50 along the roundness of the bus cover 50.

As described above, the current sensor 100 of the first embodiment engages the ferrite cover 60 with the cutout portion 52 of the bus cover 50 to fix the ferrite cover 60 and the bus cover 50. In addition, the bus bar 10 and the ferrite 20 are positioned by the ferrite cover 60 and the bus cover 50. Therefore, the positional relationship among the components of the current sensor can be stabilized.

Moreover, the current sensor 100 of the first embodiment places the substrate 40 on which the Hall element 30 is mounted to be aligned with the ferrite 20 from the lateral direction of the ferrite cover 60, and positions and fixes the substrate 40 by the substrate cover 70. This can reduce the space compared to a case where the bottom portion of the ferrite 20 is fixed and screwed on the substrate.

Figure 16A:
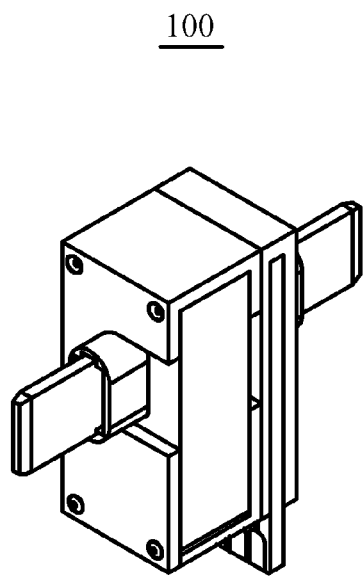
FIGS. 16A and 16B are diagrams comparing the current sensor of the first embodiment to the current sensor of the comparative example.
Figure 16B:
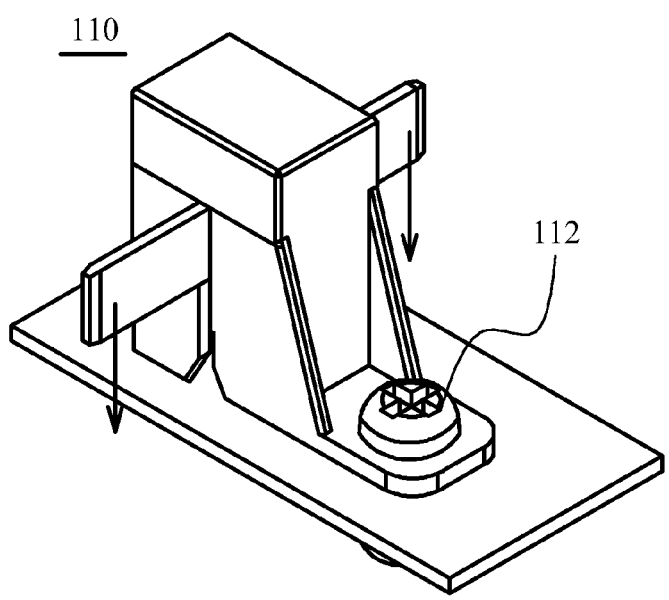

FIGS. 16A and 16B are perspective views comparing the current sensors of the first embodiment and a comparative example (different from the one illustrated in FIG. 2). As illustrated, the first embodiment (FIG. 16A) reduces an installation space for the current sensor 100 compared to the current sensor 110 of the comparative example (FIG. 16B) because a structure supporting a fall of the bus bar 10 and a screw clamp receiving a screw 112 are unnecessary. More specifically, the installation area can be reduced by approximately 60%.

Further, the current sensor 100 of the first embodiment is configured so that only one side surface of the two side surfaces of the ferrite cover 60 penetrated by the bus bar 10 engages with the cutout portion 52 of the bus cover 50. This configuration allows the bus cover 50 to separate the ferrite 20 from the bus bar 10 in the inside of the ferrite cover 60, and prevent contact between them.

In addition, the current sensor of the first embodiment is configured so that the cross sectional shape of the bus cover 50 is a nearly cross shape formed by crossing two different rectangles at their centers, and thus can accommodate two different bus bars 10. This configuration enables to quickly accommodate the specifications of the various devices because the bus bar 10 can be easily changed when the bus bar 10 is selected from several types thereof in accordance with circumstances.

Figure 17A:
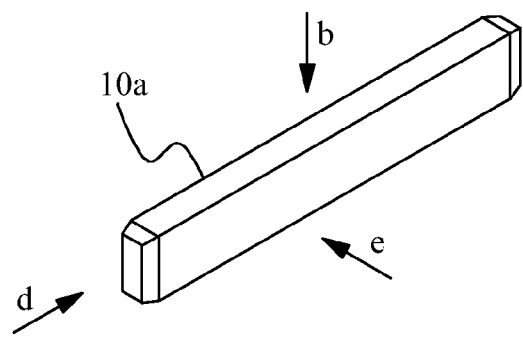
FIGS. 17A through 17D are diagrams illustrating a detailed structure of a bus bar having a different shape.
Figure 17B:
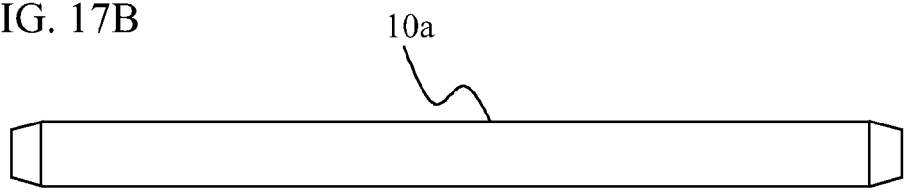
Figure 17C:
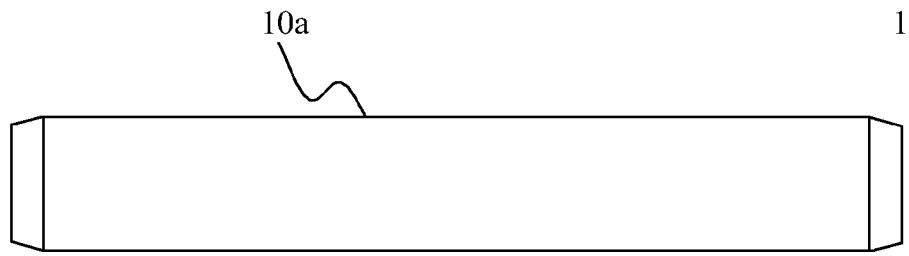
Figure 17D:
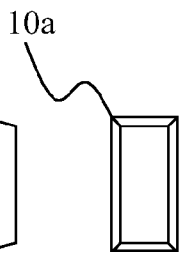

FIGS. 17A through 17D are diagrams illustrating a detailed structure of a bus bar with a different size. FIG. 17A is a perspective view, and FIGS. 17B through 17D are plan views viewed from b through d-direction in FIG. 17A. The long side of the rectangle in the cross section is short and the short side is long compared to the bus bar illustrated in FIGS. 8A through 8H. As a whole, the cross section area is large (bold) and a large amount of current can flow compared to the bus bar in FIGS. 8A through 8H.

FIGS. 18A through 18H are diagrams illustrating a state where a bus bar 10a in FIGS. 17A through 17D is inserted into the current sensor 100, and correspond to FIGS. 13A through 13H. FIG. 18A is an external perspective view, FIG. 18B is a perspective view in which the current sensor 100 is halved lengthwise. FIGS. 18C through 18H are plan views viewed from c through h-direction in FIG. 18A respectively. The same bus cover 50 is used in FIGS. 13A through 13H and FIGS. 18A through 18H, and only the shape of the bus bar is different, but the positional relationship between the bus bar 10a and the ferrite 20 is stable as with the FIGS. 13A through 13H.

Moreover, the current sensor 100 of the first embodiment forms a recess structure and a raised structure engaging with each other in the side surfaces of the ferrite cover 60 and the substrate cover 70. This configuration allows the ferrite cover 60 to directly engage with the substrate cover 70, and can achieve further stabilization. The tangible structure of the recess and raised structures is not limited to the one described in the first embodiment. For example, the recess structure and the raised structure may be formed in any of the ferrite cover 60 and the substrate cover 70, or may be formed in both. The number of and the formation position of the recess structure and the raised structure are not limited either.

[Second Embodiment]

A second embodiment engages not only a bus cover but also a bus bar with a ferrite cover.

Figure 19A:
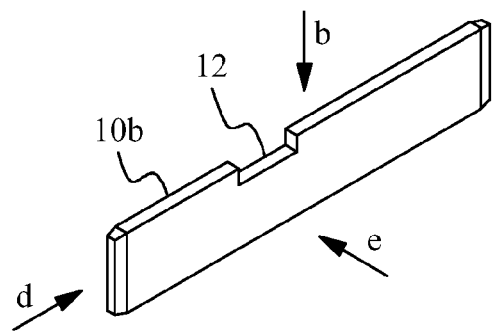
FIGS. 19A through 19D are diagrams illustrating a structure of a bus bar in accordance with a second embodiment.
Figure 19B:
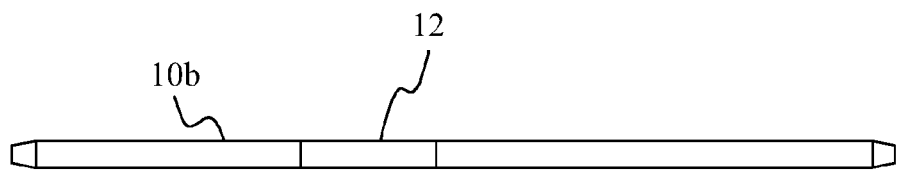
Figure 19C:
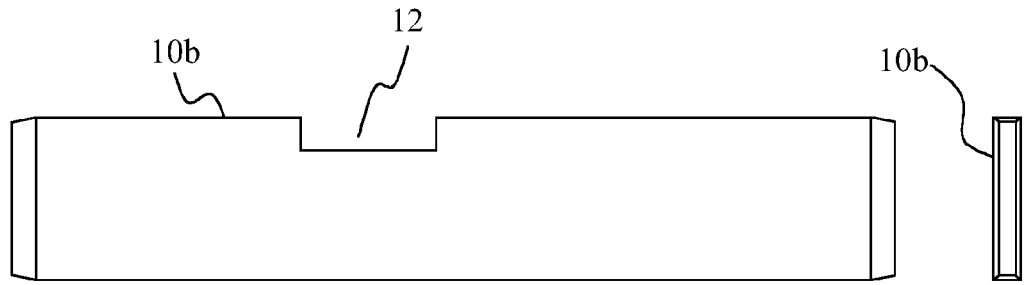
Figure 19D:
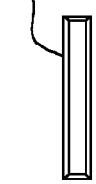

FIGS. 19A through 19D are diagrams illustrating a detailed structure of a bus bar 10b in accordance with the second embodiment. FIG. 19A is a perspective view, and FIGS. 19B through 19D are plan views viewed from b through d-direction in FIG. 19A. As illustrated in FIG. 19A and FIG. 19C, an upper edge (edge in the b-direction) of the bus bar 10b includes a recess portion 12 formed in a position corresponding to the cutout portion 52 of the bus cover 50. A shape of the recess portion 12 may be any that can engage with ferrite cover 60 and the substrate cover 70, and is not limited to the tangible structure illustrated in FIGS. 19A through 19D.

Figure 20:
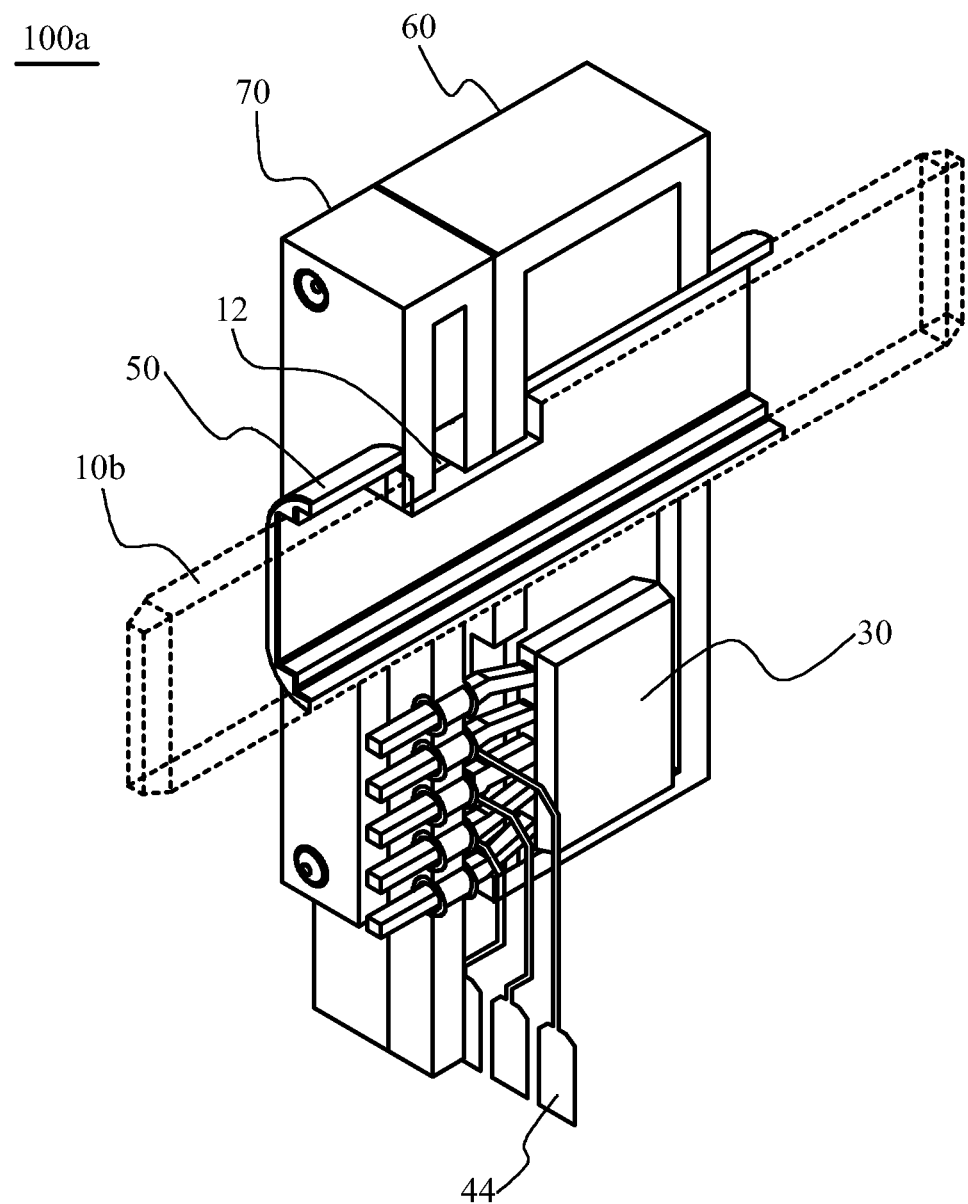
FIG. 20 is a diagram illustrating a structure of a current sensor in accordance with the second embodiment.

FIG. 20 is a completion drawing of a current sensor 100a in accordance with the second embodiment, and is a perspective view in which the current sensor 100a is halved lengthwise. An external view of the current sensor 100a is the same as that of the first embodiment, and the illustration thereof is omitted (the same as FIG. 18A and FIGS. 18C through 18H). As illustrated in FIG. 20, the substrate cover 70 and the ferrite cover 60 engage with the cutout portion 52 of the bus cover 50 and the recess portion 12 of the bus bar 10b. Thereby, unlike FIGS. 14B through 14D of the first embodiment, the bus bar 10b cannot move in the insertion direction.

Figure 21A:
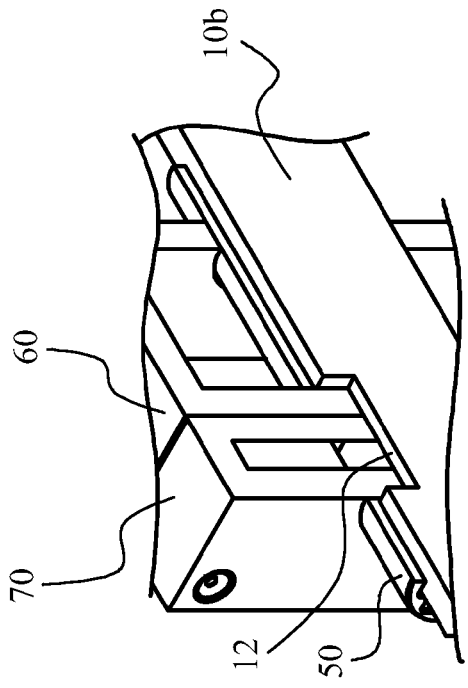
FIGS. 21A through 21D are diagrams for explaining an engaging state of components.
Figure 21B:
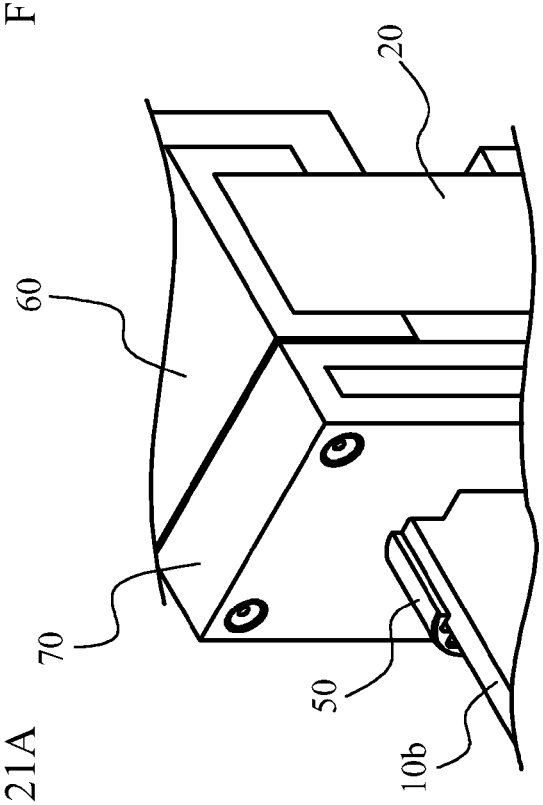
Figure 21C:
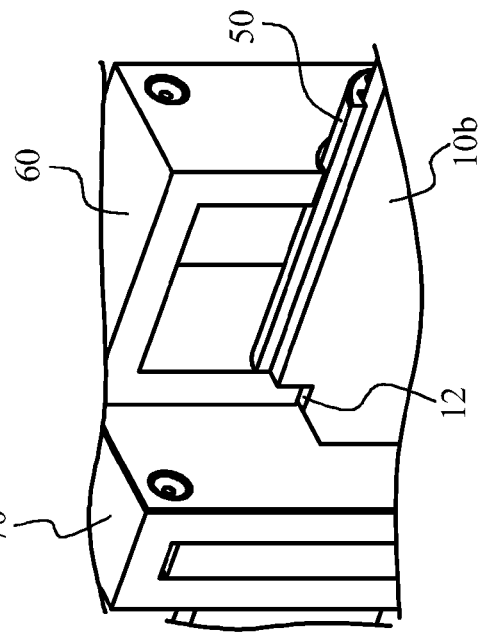
Figure 21D:
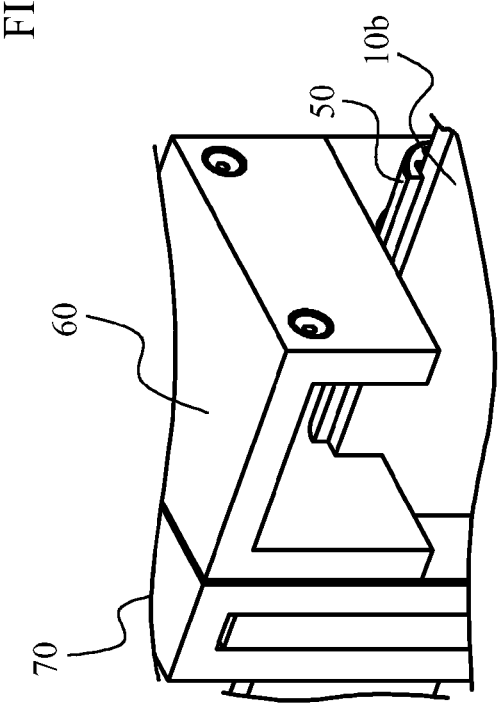

FIGS. 21A through 21D are diagrams for explaining an engaging state of components in the current sensor 100a, and enlarges the engaging part illustrated in FIG. 20. As illustrated in FIGS. 21A and 21B, the side surface at an inner side (substrate cover 70 side) of the ferrite cover 60 engages with the cutout portion 52 of the bus cover 50 and the recess portion 12 of the bus bar 10b. Moreover, as illustrated in FIGS. 21C and 21D, the side surface at an outer side (opposite side to the substrate cover 70) of the ferrite cover 60 does not engage with the cutout portion 52 of the bus cover 50, and contacts the bus cover 50 along the roundness of the outerward of the bus cover 50.

as described above, the current sensor 100a of the second embodiment engages the ferrite cover 60 with the recess portion 12 located in the bus bar 10b to fix the position of the bus bar 10b, and thereby, can achieve futher stabilization.

[Third Embodiment]

A third embodiment achieves further fixation of the substrate cover 70 by pins.

Figure 22A:
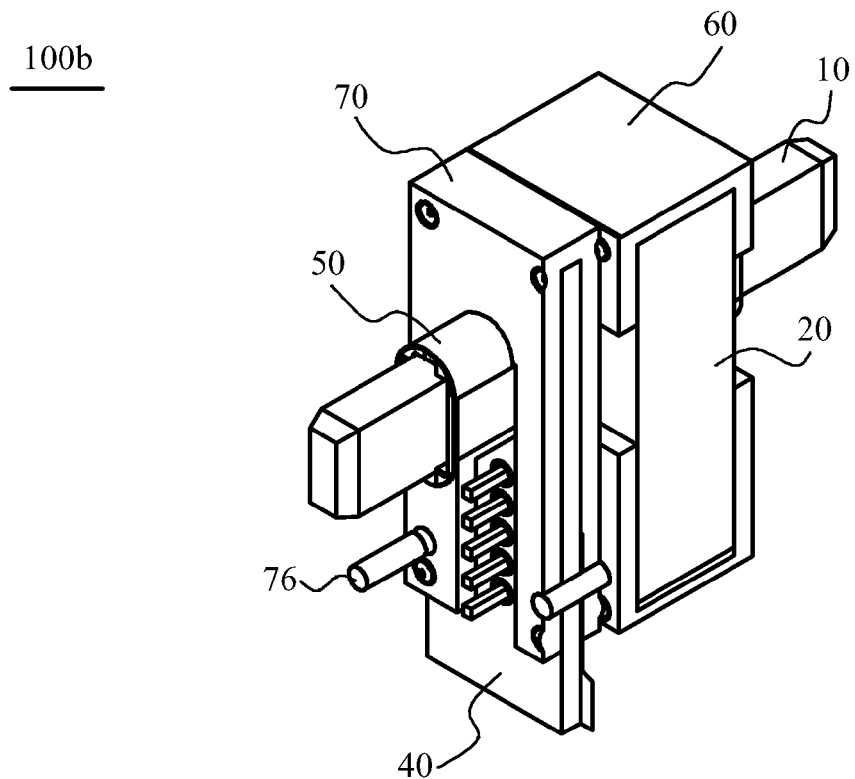
FIGS. 22A and 22B are diagrams illustrating a structure of a current sensor in accordance with a third embodiment.
Figure 22B:
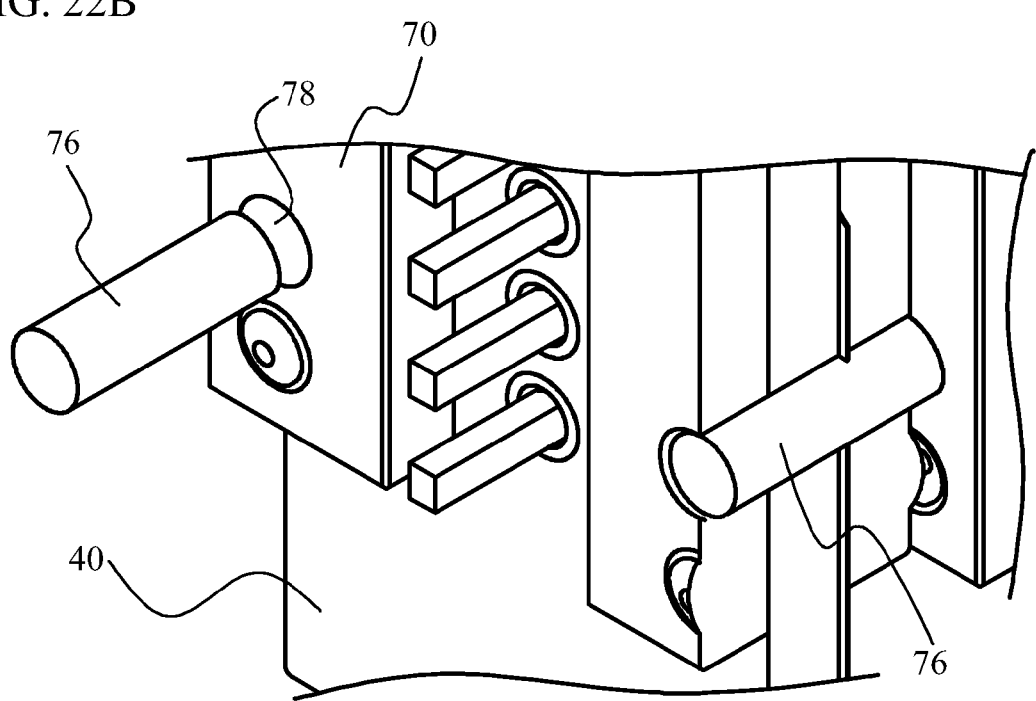

FIG. 22A is an external perspective view (partly cross-sectional view) of a current sensor 100b of the third embodiment, and FIG. 22B is an enlarged view of a pin insertion area. As illustrated in FIG. 22B, in the current sensor 100b, penetration holes through which pins 76 penetrate are formed in the substrate 40 and the substrate cover 70 (numeral reference 78 represents the penetration holes of the substrate cover 70). The pins 76 penetrating through the penetration holes for fixation require detachment of the pins 76 when the current sensor 100b is deconstructed, and thus the substrate 40 and the substrate cover 70 are further stably fixed. Instead of the pins 76, a member such as a screw may be used. The member may be any that can fix the substrate 40 and the substrate cover 70 through the penetration holes formed in them, and is not limited to the present embodiment.

[Fourth Embodiment]

A fourth embodiment mounts the substrate 40 on to a bottom of the ferrite 20.

Figure 23A:
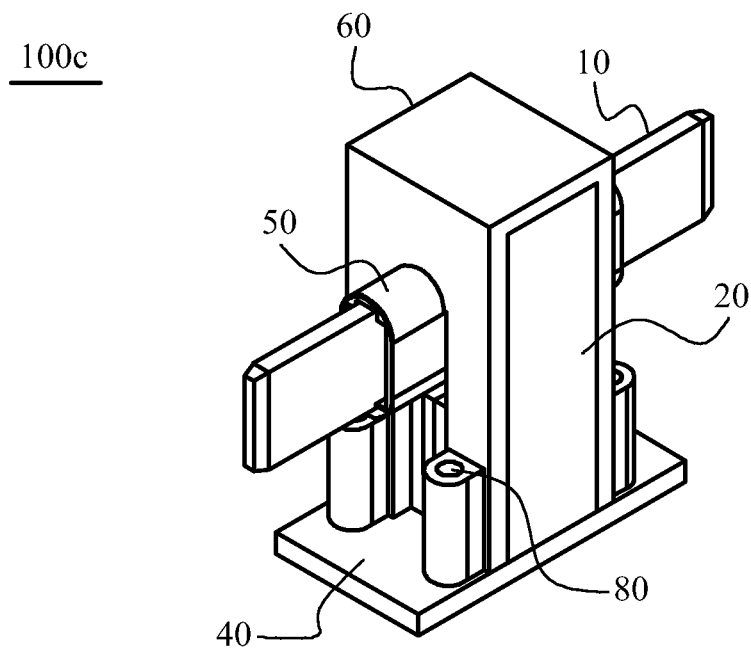
FIGS. 23A through 23C are diagrams illustrating a structure of a current sensor in accordance with a fourth embodiment.
Figure 23B:
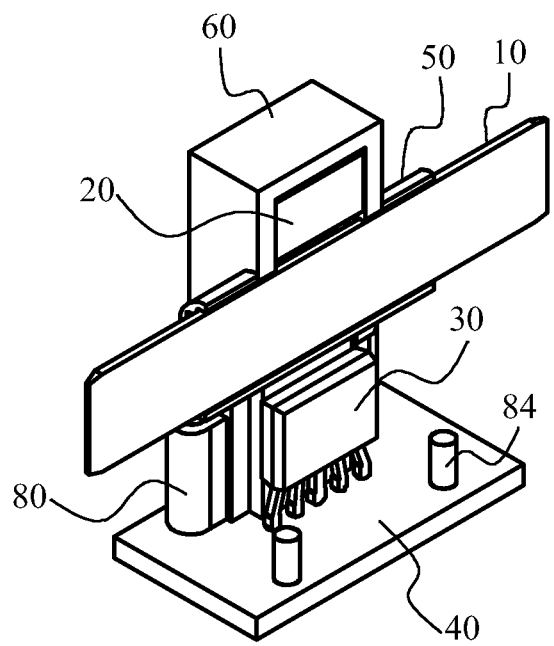
Figure 23C:
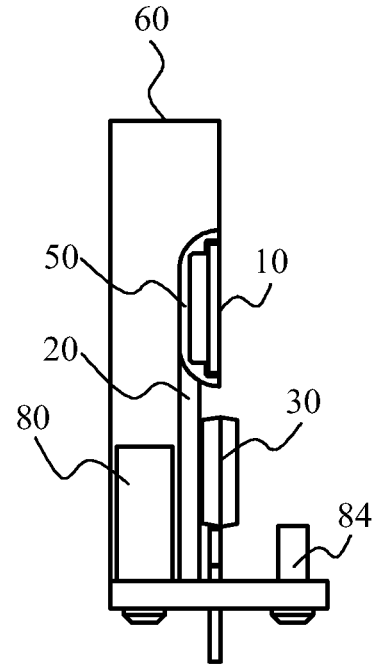

FIGS. 23A through 23C are diagrams illustrating a structure of a current sensor 100c in accordance with the fourth embodiment. FIG. 23A is an external perspective view, FIG. 23B is a cross-sectional view in which the current sensor 100c is halved lengthwise, and FIG. 23C is a plan view that views FIG. 23B from the insertion direction of the bus bar 10. As illustrated, the Hall element 30 is fixed to the substrate 40 so as to protrude upward, the ferrite 20 and the ferrite cover 60 are placed from the upper direction of the substrate 40, and thereby, the Hall element 30 is inserted into the gap 24 of the ferrite 20. As illustrated in FIGS. 23B and 23C, the ferrite cover 60 includes a reception portion 80 into which a screw can be inserted from a bottom, and a pin or screw 84 is caused to penetrate from the back side of the substrate 40 to be inserted into the reception portion 80 of the ferrite cover 60, and thereby the ferrite cover 60 and the substrate 40 are fixed to each other.

Unlike the first through third embodiments, the current sensor 100c of the fourth embodiment does not include the substrate cover 70, and the ferrite cover 60 engages with the cutout portion 52 of the bus cover 50 alone. Therefore, as illustrated in FIG. 23B, two sides surface of the ferrite cover 60 penetrated by the bus bar 10 engage with the cutout portion 52 of the bus cover 50, and thereby the bus cover 50 and the ferrite cover 60 are positioned with respect to each other. The ferrite cover 60 is inserted from the upper direction of the ferrite 20, and thus the ferrite cover 60 does not have a structure supporting the bus cover 50, and the bus cover 50 is directly supported by the ferrite 20 as illustrated in FIG. 23C.

As described above, even the current sensor 100c of the fourth embodiment that does not use the substrate cover 70 can also engage the ferrite cover 60 with the bus cover 50 using the cutout portion 52 of the bus cover 50 as the first through third embodiments do.

Figure 24A:
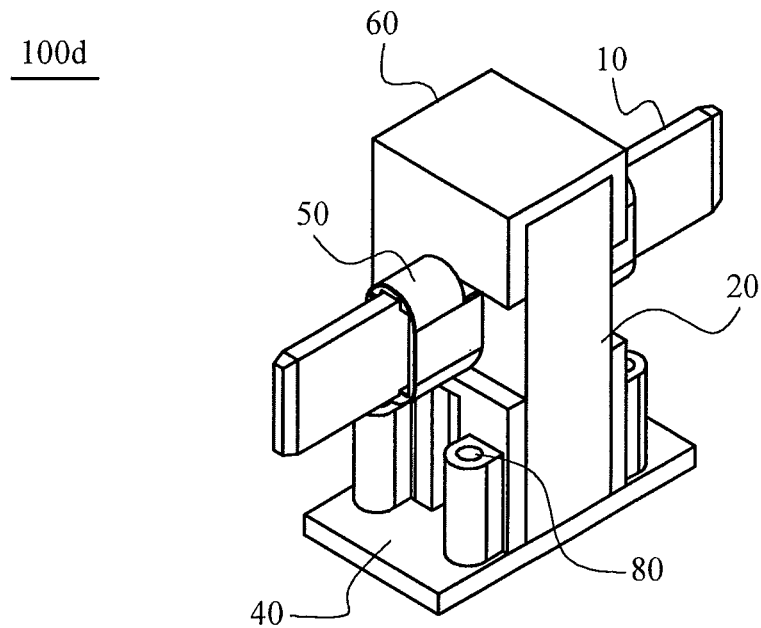
FIGS. 24A through 24C are diagrams illustrating a structure of a current sensor in accordance with a variation of the fourth embodiment.
Figure 24B:
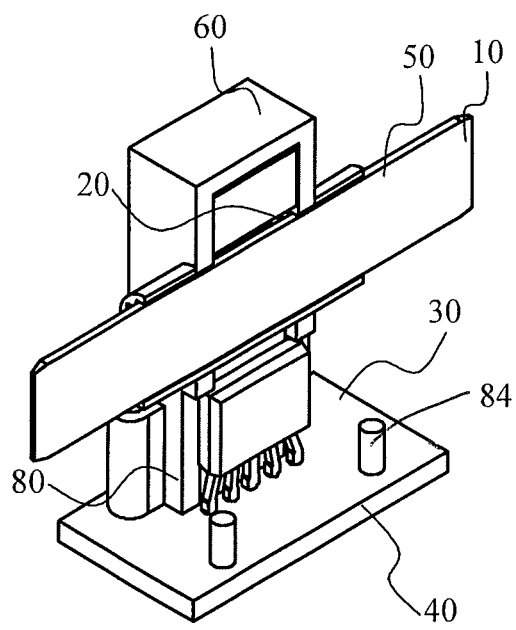
Figure 24C:
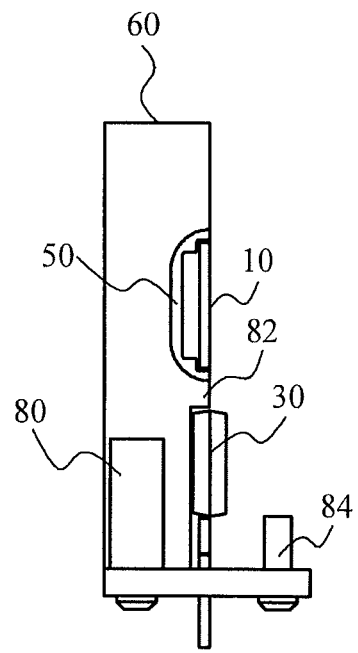
Figure 25A:
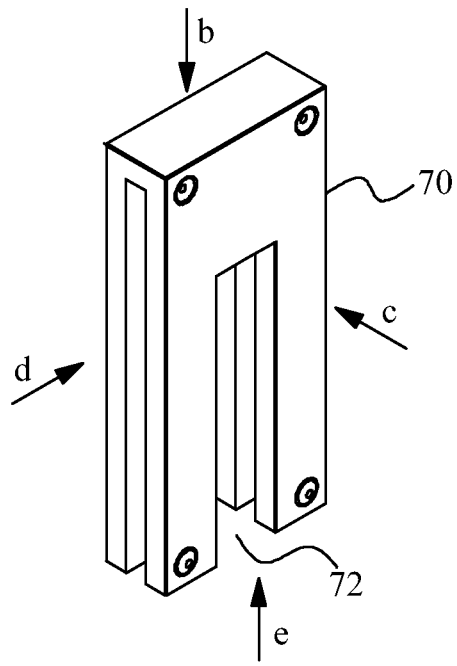
FIGS. 25A through 25E are diagrams illustrating a variation of the substrate cover.
Figure 25B:
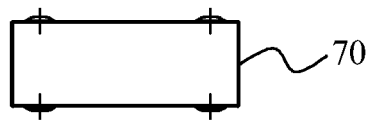
Figure 25C:
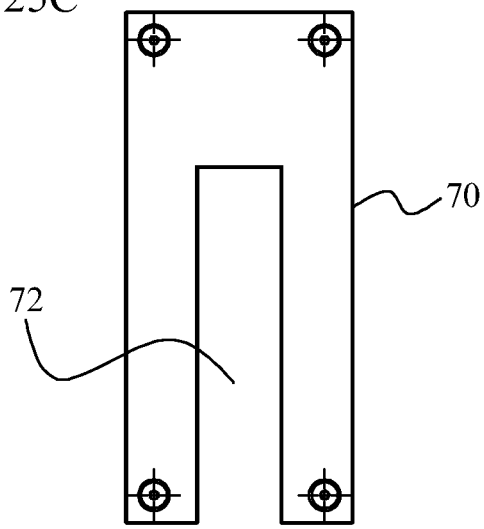
Figure 25D:
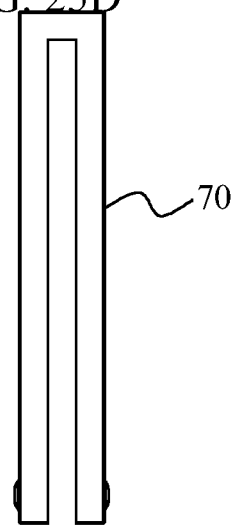
Figure 25E:
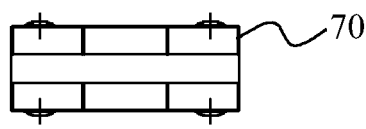

FIGS. 24A through 24C are diagrams illustrating a structure of the current sensor 100c in accordance with a variation of the fourth embodiment. FIG. 24A is an external perspective view, FIG. 24B is a cross-sectional view in which the current sensor 100c is halved lengthwise, and FIG. 24C is a plan view that views FIG. 24B from the insertion direction of the bus bar 10. Unlike FIGS. 23A through 23C, the recess portion 64 formed in the side surface of the ferrite cover 60 communicates with the opening portion 62 in the side surface of the ferrite cover 60, and the ferrite cover 60 can be mounted on to the ferrite 20 from a horizontal direction. This configuration allows support the bus cover 50 by a support portion 82 of the ferrite cover 60 from a direction of gravity. The ferrite 20 breaks easily, but this configuration can prevent damage to the ferrite 20.

Figure 12C:
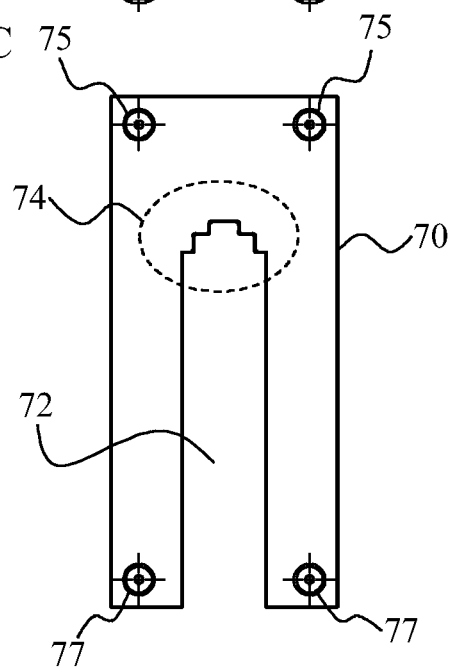
Figure 12D:
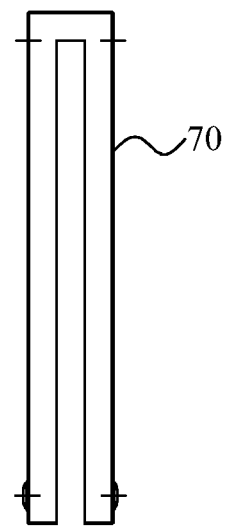
Figure 12E:
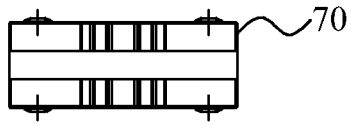

The first through fourth embodiments configure a recess portion in the substrate cover 70 to have a step-like shape as illustrated in FIG. 12C, but the configuration of the recess portion is not limited to the embodiments, and may be any that can engage with the cutout portion 52 of the bus cover 50. For example, as illustrated in FIGS. 25A through 25E, a substrate cover of which the shape of the base of the recess portion is a simple rectangle may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A current sensor comprising:
   a current bar through which a current flows;
   a first cover that includes an opening into which the current bar is contactably inserted and includes a cutout portion formed in at least a part thereof;
   a magnetic substance core that covers a part of the first cover into which the current bar is inserted and includes a gap;
   a magnetic field measuring element located in the gap; and
   a second cover that covers the magnetic substance core, and includes a side surface engaging with the cutout portion of the first cover.

2. The current sensor according to claim 1, further comprising:
   a substrate to which the magnetic field measuring element is fixed, and in which a penetration hole that is penetrated by the current bar is formed; and
   a third cover that covers the substrate and includes a side surface engaging with the cutout portion of the first cover.

3. The current sensor according to claim 2, wherein one side surface of the second cover and one side surface of the third cover contact with each other.

4. The current sensor according to claim 3, wherein
   a raised portion is formed in at least one of the side surfaces of the second cover and the third cover contacting with each other, and
   a recess portion is formed in at least the other of the side surfaces contacting with each other.

5. The current sensor according to claim 2, further comprising:
   a fixing member that penetrates the substrate and the third cover.

6. The current sensor according to claim 1, wherein
   a cross section sectional shape of the opening in the first cover is stepped so as to accommodate current bars with different sizes.

7. The current sensor according to claim 1, wherein
   the current bar includes a recess portion formed in a position corresponding to the cutout portion of the first cover, and
   a side surface of the second cover engages with the recess portion.

8. The current sensor according to claim 1, wherein
   the second cover includes a support portion that supports the first cover from a direction of gravity.

9. The current sensor according to claim 2, wherein
   a slit is formed in a side surface of the second cover, and
   the magnetic field measuring element is inserted into the gap of the magnetic substance core from the slit.

10. A current sensor comprising:
    a current bar through which a current flows;
    a first cover that covers the current bar and includes a cutout portion formed in at least a part thereof;
    a magnetic substance core that covers at least parts of the current bar and the first cover and includes a gap;
    a magnetic field measuring element located in the gap;
    a second cover that covers the magnetic substance core and the magnetic field measuring element and at least parts of the current bar and the first cover, and is located so that a side surface of the second cover engages with the cutout portion of the first cover;

a substrate to which the magnetic field measuring element is fixed, and in which a penetration hole that is penetrated by the current bar is formed; and a third cover that fixes the substrate to the first cover, wherein the magnetic field measuring element is inserted into the gap of the magnetic substance core from a slit formed in a side surface of the second cover, and the third cover covers the substrate and at least parts of the current bar and the first cover, and is located so that a side surface of the third cover engages with the cutout portion of the first cover.

11. The current sensor according to claim 10, wherein the second cover has a first side surface that is one of two side surfaces penetrated by the current bar and engages with the cutout portion of the first cover;

the third cover has a first side surface that is one of two side surfaces penetrated by the current bar and engages with the cutout portion of the first cover, and second side surfaces, out of the two side surfaces of the second cover and the third cover, that fail to engage with the cutout portion, and that contact with each other.

12. The current sensor according to claim 11, wherein a raised portion is formed in at least one of the second side surfaces contacting with each other in the second cover and the third cover, and a recess portion is formed in at least the other of the second surfaces.

13. The current sensor according to claim 10, further comprising:

a fixing member that penetrates the substrate and the third cover.

* * * * *

UNITED STATES PATENT AND TRADEMARK OFFICE
CERTIFICATE OF CORRECTION

PATENT NO. : 9,250,273 B2  
APPLICATION NO. : 13/933796  
DATED : February 2, 2016  
INVENTOR(S) : Naoyuki Nagao Page 1 of 1

It is certified that error appears in the above-identified patent and that said Letters Patent is hereby corrected as shown below:

In the claims

Column 10, Line 42, Claim 6  
Delete "cross section sectional" and insert -- cross-sectional --, therefor.

Signed and Sealed this  
Tenth Day of May, 2016

Michelle K. Lee  
*Director of the United States Patent and Trademark Office*